(12) United States Patent
Ito et al.

(10) Patent No.: US 12,283,628 B2
(45) Date of Patent: Apr. 22, 2025

(54) SEMICONDUCTOR DEVICE, POWER CONVERSION DEVICE AND METHOD OF MANUFACTURING SEMICONDUCTOR DEVICE

(71) Applicant: Mitsubishi Electric Corporation, Tokyo (JP)

(72) Inventors: Masanao Ito, Tokyo (JP); Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 588 days.

(21) Appl. No.: 17/609,786

(22) PCT Filed: Jul. 16, 2019

(86) PCT No.: PCT/JP2019/027855
§ 371 (c)(1),
(2) Date: Nov. 9, 2021

(87) PCT Pub. No.: WO2021/009828
PCT Pub. Date: Jan. 21, 2021

(65) Prior Publication Data
US 2022/0231160 A1 Jul. 21, 2022

(51) Int. Cl.
*H01L 29/78* (2006.01)
*H01L 21/265* (2006.01)
(Continued)

(52) U.S. Cl.
CPC .... *H01L 29/7811* (2013.01); *H01L 21/26586* (2013.01); *H01L 29/0696* (2013.01); *H01L 29/47* (2013.01); *H02M 7/53871* (2013.01)

(58) Field of Classification Search
CPC .......... H01L 29/7811; H01L 21/26586; H01L 29/0696; H01L 29/47; H01L 29/0619;
(Continued)

(56) References Cited

U.S. PATENT DOCUMENTS

2002/0074596 A1* 6/2002 Suzuki ............... H01L 29/0634
257/330
2003/0132450 A1* 7/2003 Minato ............... H01L 29/0653
257/E21.345
(Continued)

FOREIGN PATENT DOCUMENTS

DE 11 2017 002 113 T5 1/2019
JP 2007-227620 A 9/2007
(Continued)

OTHER PUBLICATIONS

German Office Action issued Jun. 29, 2023 in corresponding German Patent Application No. 11 2019 007 551 .9 (with English translation), 12 pages.
(Continued)

*Primary Examiner* — Khaja Ahmad
*Assistant Examiner* — Khatib A Rahman
(74) *Attorney, Agent, or Firm* — XSENSUS LLP

(57) ABSTRACT

A semiconductor device includes a semiconductor layer including a super junction layer in which an n-type pillar layer and a p-type pillar layer are alternately disposed and a p-type withstand voltage holding structure formed on an upper layer part of the semiconductor layer to surround an active region. At least one withstand voltage holding structure overlaps with the super junction layer in a plan view. At least one withstand voltage holding structure overlapping with the super junction layer in a plan view has a gap which is an intermittent part of the withstand voltage holding structure.

17 Claims, 27 Drawing Sheets

(51) Int. Cl.
*H01L 29/06* (2006.01)
*H01L 29/47* (2006.01)
*H02M 7/5387* (2007.01)

(58) Field of Classification Search
CPC ............ H01L 29/6606; H01L 29/1608; H01L 29/0634; H01L 29/861; H01L 29/868; H01L 29/872; H02M 7/53871; H02M 1/32; H02M 7/5387; H02M 7/003
See application file for complete search history.

(56) References Cited

U.S. PATENT DOCUMENTS

| | | | | |
|---|---|---|---|---|
| 2004/0016959 | A1* | 1/2004 | Yamaguchi | H01L 29/0634 257/341 |
| 2005/0077572 | A1* | 4/2005 | Yamauchi | H01L 29/0634 257/341 |
| 2005/0133859 | A1* | 6/2005 | Kuwahara | H01L 29/0634 257/328 |
| 2005/0184336 | A1* | 8/2005 | Takahashi | H01L 29/66712 257/E21.418 |
| 2006/0043478 | A1* | 3/2006 | Yamaguchi | H01L 29/7811 257/341 |
| 2006/0124997 | A1* | 6/2006 | Yamauchi | H01L 29/0615 257/E29.066 |
| 2007/0177444 | A1* | 8/2007 | Miyajima | H01L 29/0634 365/221 |
| 2010/0264489 | A1* | 10/2010 | Ohta | H01L 29/7811 257/334 |
| 2016/0087031 | A1 | 3/2016 | Ebihara et al. | |
| 2019/0057873 | A1* | 2/2019 | Sugahara | H01L 21/28 |
| 2019/0074386 | A1* | 3/2019 | Ebihara | H01L 29/1608 |

FOREIGN PATENT DOCUMENTS

| | | |
|---|---|---|
| JP | 2013-51434 A | 3/2013 |
| WO | 2014/208201 A1 | 12/2014 |
| WO | 2017/169086 A1 | 10/2017 |
| WO | 2017/183375 A1 | 10/2017 |

OTHER PUBLICATIONS

International Search Report and Written Opinion mailed on Oct. 15, 2019, received for PCT Application PCT/JP2019/027855, Filed on Jul. 16, 2019, 10 pages including English Translation.

Chinese Office Action issued Jan. 10, 2024, in corresponding Chinese Patent Application No. 201980098323.X, 18 pages.

Japanese Office Action issued Sep. 20, 2022 in corresponding Japanese Patent Application No. 201-532584 (with machine-generated English translation), 10 pages.

\* cited by examiner

F I G. 2
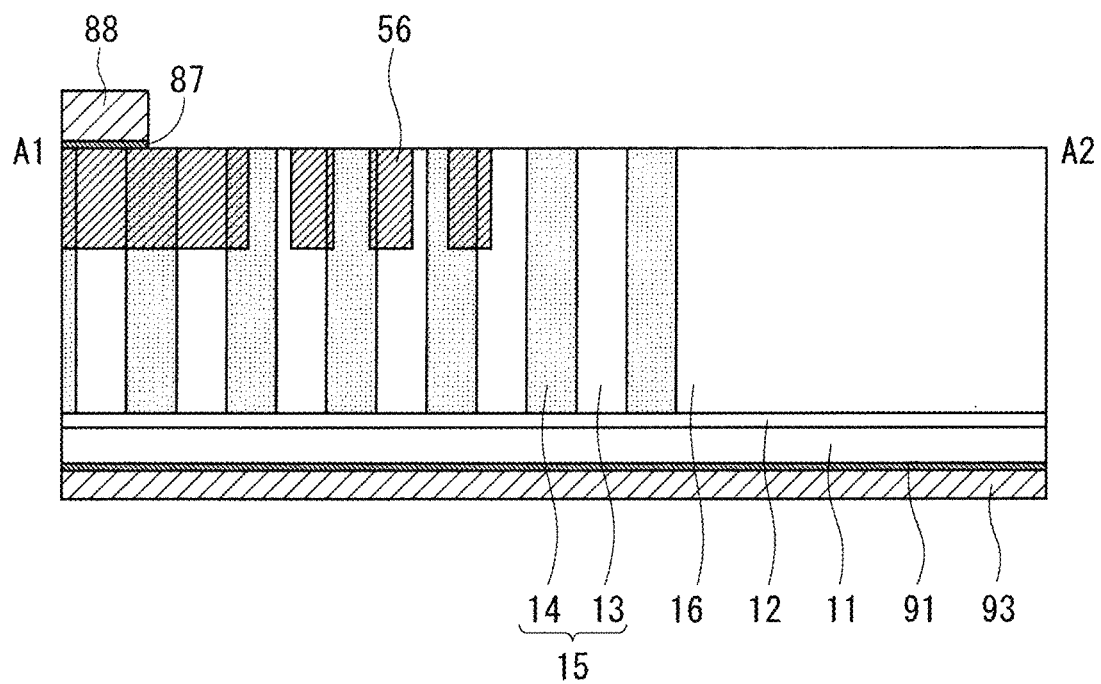

11

F I G. 23
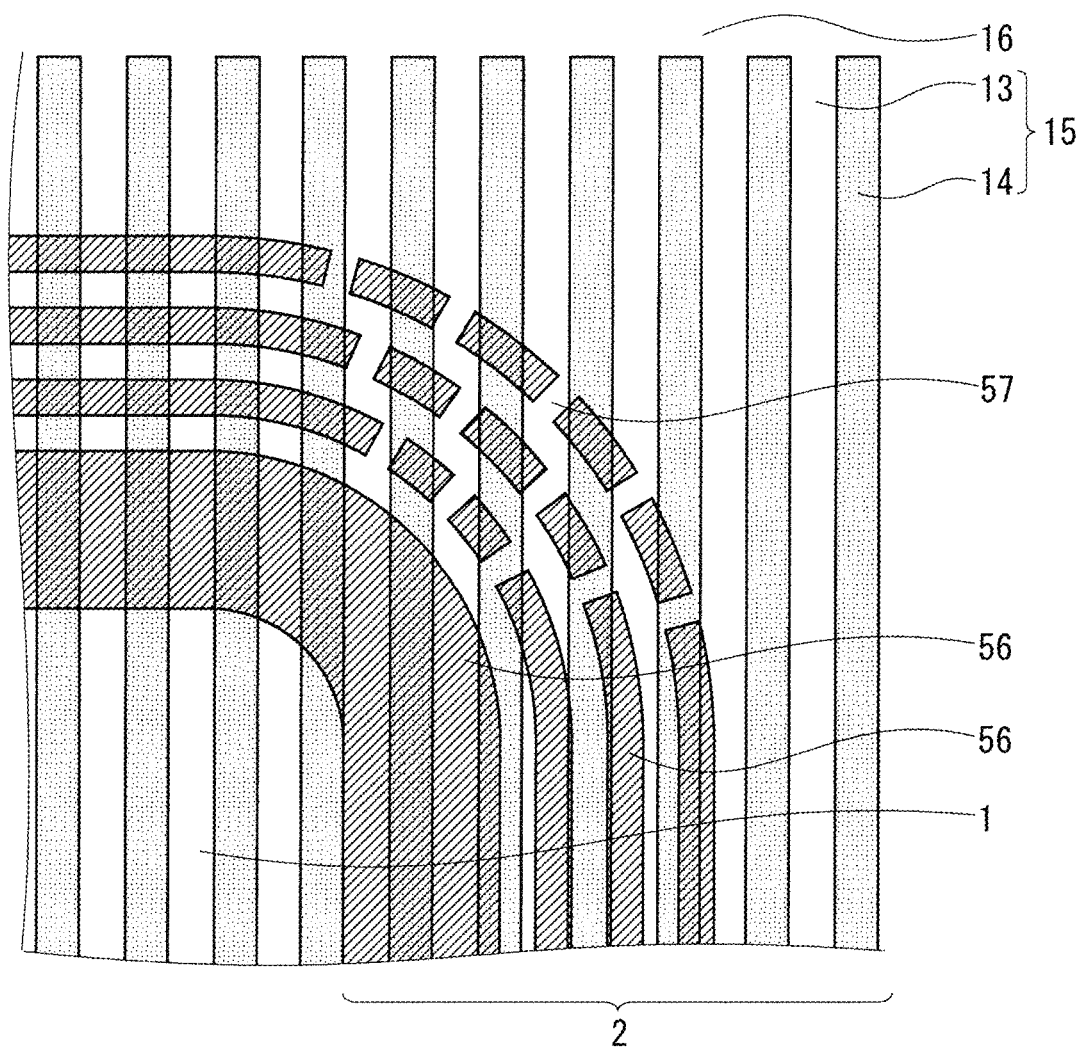

SEMICONDUCTOR DEVICE, POWER CONVERSION DEVICE AND METHOD OF MANUFACTURING SEMICONDUCTOR DEVICE

CROSS-REFERENCE TO RELATED APPLICATION

The present application is based on PCT filing PCT/JP2019/027855, filed Jul. 16, 2019, the entire contents of which are incorporated herein by reference.

TECHNICAL FIELD

The present invention relates to a semiconductor device, a power conversion device, and a method of manufacturing the semiconductor device, and particularly to a semiconductor device having a super junction structure.

BACKGROUND ART

A switching element such as a metal-oxide-semiconductor field-effect transistor (MOSFET) or an insulated-gate bipolar transistor (IGBT) and a rectifying element such as a Schottky barrier diode (SBD) are used as a semiconductor device for driving a load of an electrical motor such as a motor in a power electronics field. In the switching element, an ON state (conductive state) of low resistance and an OFF state (interrupting state) of high resistance are switched using a control signal inputted to a control terminal of the switching element. In the rectifying element, an ON state and an OFF state are switched in accordance with a state of a switching element connected to the rectifying element, for example.

High voltage is input in a usage of power electronics, thus it is important that the semiconductor device such as the switching element and the rectifying element has high withstand voltage in the OFF state. The switching element and the rectifying element in the OFF state generally extend a depletion layer in a drift layer, thereby maintaining voltage. Thus, these elements have higher withstand voltage as a thickness of the drift layer increases, and have higher withstand voltage as an impurity concentration of the drift layer decreases by reason that the depletion layer extends easily.

In the meanwhile, the semiconductor device needs to have low resistance in the ON state (ON resistance) to reduce a conduction loss. The resistance of the drift layer is one of components of the ON resistance, and is preferably reduced as much as possible. The resistance of the drift layer can be reduced by reducing the thickness of the drift layer or increasing the impurity concentration of the drift layer. However, when the thickness of the drift layer is reduced or the impurity concentration of the drift layer is increased as described above, the withstand voltage is reduced. As described above, the withstand voltage and the ON resistance of the semiconductor device have a trade-off relationship.

A super junction structure is known as a structure of the semiconductor device capable of improving the trade-off (for example, Patent Document 1 described below). That is to say, the semiconductor device having the super junction structure can reduce the ON resistance while keeping the withstand voltage or increase the withstand voltage while keeping the ON resistance compared with a semiconductor device which does not have the super junction structure.

In the super junction structure, a p-type pillar layer and an n-type pillar layer are alternately disposed on a surface vertical to a direction in which current flows in the semiconductor device, and charge balance is achieved to equalize an amount of effective impurity in the p-type pillar layer and an amount of effective impurity in the n-type pillar layer. Herein, the amount of effective impurity indicates an amount of impurity effectively acting as an acceptor in a p-type semiconductor and an amount of impurity effectively acting as a donor in an n-type semiconductor. A layer made up of the p-type pillar layer and the n-type pillar layer alternately disposed in a semiconductor layer in which the super junction structure is formed is referred to as "the super junction layer" hereinafter.

A shape of the p-type pillar layer and the n-type pillar layer includes a reed shape and a columnar shape, for example. For example, when each of the p-type pillar layer and the n-type pillar layer has the reed shape, the p-type pillar layer and the n-type pillar layer are disposed in a stripe form in a plan view. When the p-type pillar layer or the n-type pillar layer has the columnar shape, one pillar layer is disposed in a dotted form in the other pillar layer in a plan view. Particularly, the super junction layer having the stripe shape is compatible with a trench gate type semiconductor device, and is appropriate for reducing the resistance. There is an advantage that the super junction layer having the stripe shape has a simple structure compared with the super junction layer having the dotted shape, and a design and a process are relatively easy.

A method of forming the super junction structure mainly includes two method of a multi-epitaxial method and a trench-filling method. The multi-epitaxial method is a method of repeating an epitaxial growth of a semiconductor layer of a first conductivity type and an ion implantation of a second conductivity type impurity, and the number of repeating the process is determined by a necessary thickness of a super junction layer and an implantable depth of the ion implantation. The thickness of the super junction layer is generally set to several μm, but is set to equal or larger than several tens of μm in a device having high withstand voltage in some cases. The number of repeating the epitaxial growth and the ion implantation increases to form such a thick super junction layer by the multi-epitaxial method.

In the meanwhile, the trench-filling method is a method of epitaxially growing a semiconductor layer of a first conductivity type to have a thickness necessary for a super junction layer, forming a trench in the semiconductor layer by anisotropic etching, and then epitaxially growing a semiconductor layer of a second conductivity type to fill the trench. The trench-filling method has a small number of processes, and is excellent in mass productivity compared with the multi-epitaxial method.

For example, a step-flow growth epitaxially growing silicon carbide (SiC) on a specific crystal plane is general as an epitaxial growth of silicon carbide. An Off angle is provided in a general silicon carbide substrate to achieve the step-flow growth. In the epitaxial growth of silicon carbide, it is hard to perform the epitaxial growth on a crystal plane other than the specific crystal plane described above. Thus, when the super junction structure is formed on the semiconductor substrate made of silicon carbide by the trench-filling method, it is required that a longitudinal direction of the pillar layer of the second conductivity type coincides with a direction of the step-flow growth (the step-flow direction). Thus, a structure of alternately arranging the p-type pillar layer and the n-type pillar layer extending in the step-flow direction is general as the structure of the super junction layer having the stripe shape.

As described above, the super junction layer having the stripe shape has an advantage in reduction of the resistance and easiness of design and manufacture of the semiconductor device. Particularly, in a silicon carbide semiconductor device, a super junction layer having a stripe shape is mostly adopted for a reason of processes.

PRIOR ART DOCUMENTS

Patent Documents

Patent Document 1: International Publication No. 2017/183375

SUMMARY

Problem to be Solved by the Invention

Patent Document 1 discloses a termination structure including a plurality of frame-like withstand voltage holding structures surrounding an active region and having a conductivity opposite to that of a drift layer as a termination structure of a semiconductor device having a super junction structure. A plurality of p-type pillar layers are disposed in a stripe form in the active region, and each of the plurality of withstand voltage holding structure has a side extending in parallel to the p-type pillar layer and a side perpendicular to the p-type pillar layer in a plan view.

When the termination structure including the plurality of frame-like withstand voltage holding structures is used as with Patent Document 1, a distribution of potential in a revolving direction of the active region is smaller than a case of a typical termination structure including only one frame-like withstand voltage holding structure (for example, a junction termination extension (JTE) or a reduced surface field (RESURF)), and an electrical field concentration is reduced, thus the withstand voltage is increased.

However, it is considered that there is a large potential difference, which is several tens of percent of voltage applied to the semiconductor device, in the revolving direction of the active region around a corner part of the frame-like withstand voltage holding structure. The frame-like withstand voltage holding structure is electrically conductive over a whole outer periphery of the active region, thus cannot hold the potential difference in the revolving direction of the active region. Accordingly, the potential difference is held between a certain withstand voltage holding structure 56 and another withstand voltage holding structure 56 adjacent to an inner side or an outer side of the certain withstand voltage holding structure 56, and an electrical field concentration occurs in that part.

The present invention is therefore has been made to solve problems as described above, and it is an object to reduce an electrical field concentration in a termination region in a semiconductor device having a super junction structure.

Means to Solve the Problem

A semiconductor device according to the present invention includes: a semiconductor substrate; a semiconductor layer formed on the semiconductor substrate and including a super junction layer in which a first pillar layer of a first conductivity type and a second pillar layer of a second conductivity type are alternately disposed; and a plurality of withstand voltage holding structures of a second conductivity type formed on an upper layer part of the semiconductor layer to surround an active region, wherein at least one of the withstand voltage holding structures overlaps with the super junction layer in a plan view, and at least one of the withstand voltage holding structures overlapping with the super junction layer in a plan view has at least one gap which is an intermittent part of at least one of the withstand voltage holding structures.

Effects of the Invention

According to the present invention, the withstand voltage structure has the gap, thus the withstand voltage holding structure can hold a potential difference in a revolving direction of the active region. Accordingly, an electrical field concentration in a termination region is reduced, and the withstand voltage of the semiconductor device can be increased.

These and other objects, features, aspects and advantages of the present invention will become more apparent from the following detailed description when taken in conjunction with the accompanying drawings.

BRIEF DESCRIPTION OF DRAWINGS

FIG. 2 A schematic cross-sectional view illustrating a cross section vertical to a longitudinal direction of a p-type pillar layer of the semiconductor device as the premise technique.

FIG. 23 A schematic plan view around a corner part of a termination structure in a semiconductor device according to an embodiment 5.

DESCRIPTION OF EMBODIMENT(S)

Figure 1:
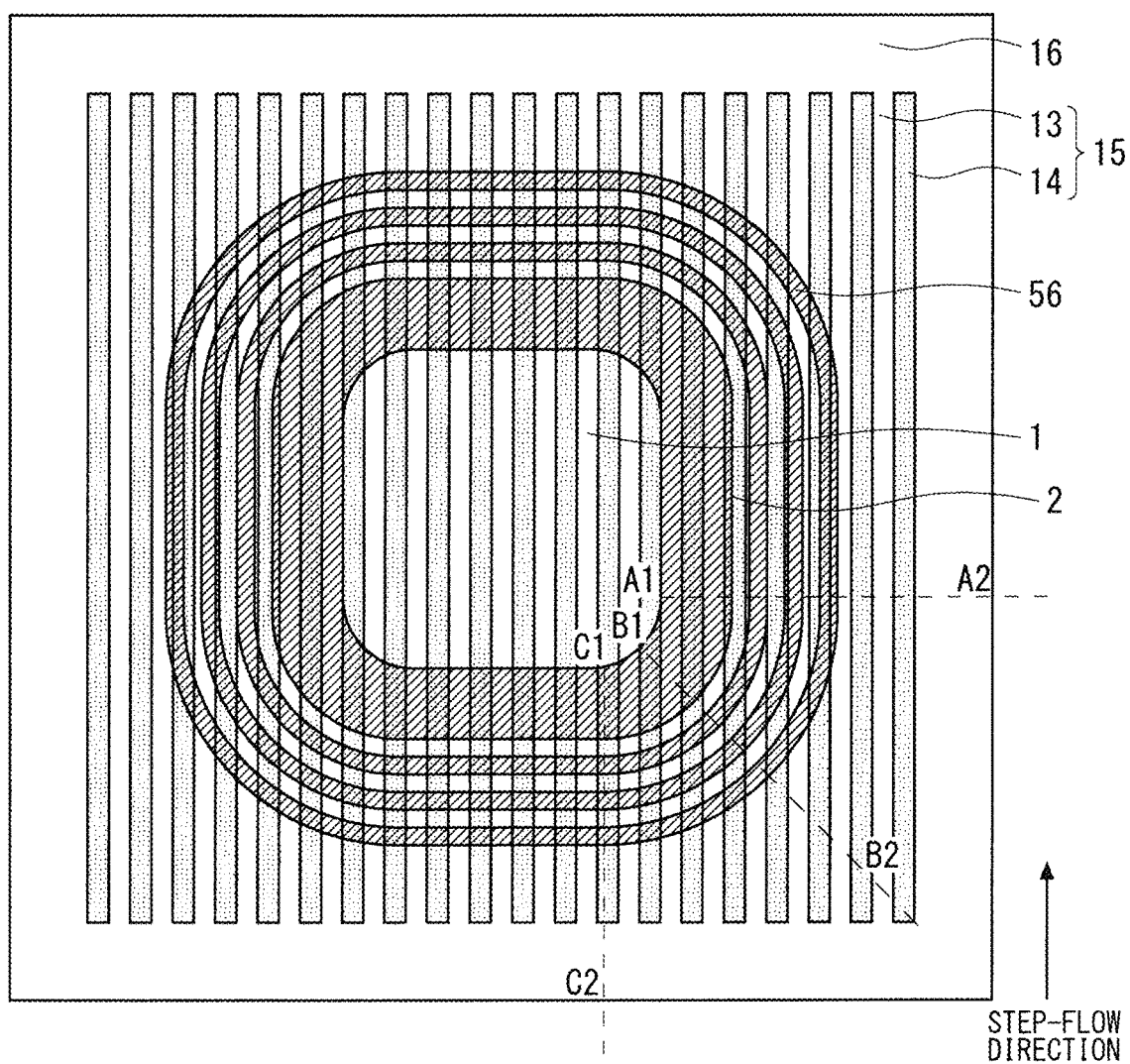
FIG. 1 A schematic plan view of a semiconductor device including a super junction structure as a premise technique.

In the present specification, a silicon carbide SBD is described as an example of a semiconductor device. In the description hereinafter, a first conductivity type is an n type and a second conductivity type is a p type. The drawings are schematically described hereinafter, thus a scale of each constituent element is not necessarily constant. Thus, dimensions and positional relationships of the constituent elements illustrated in the drawings are different from reality in some cases. The description of constituent elements which are unnecessary for explanation is omitted in all the drawings for convenience in drawing figures.

<Premise Technique>

Figure 3:
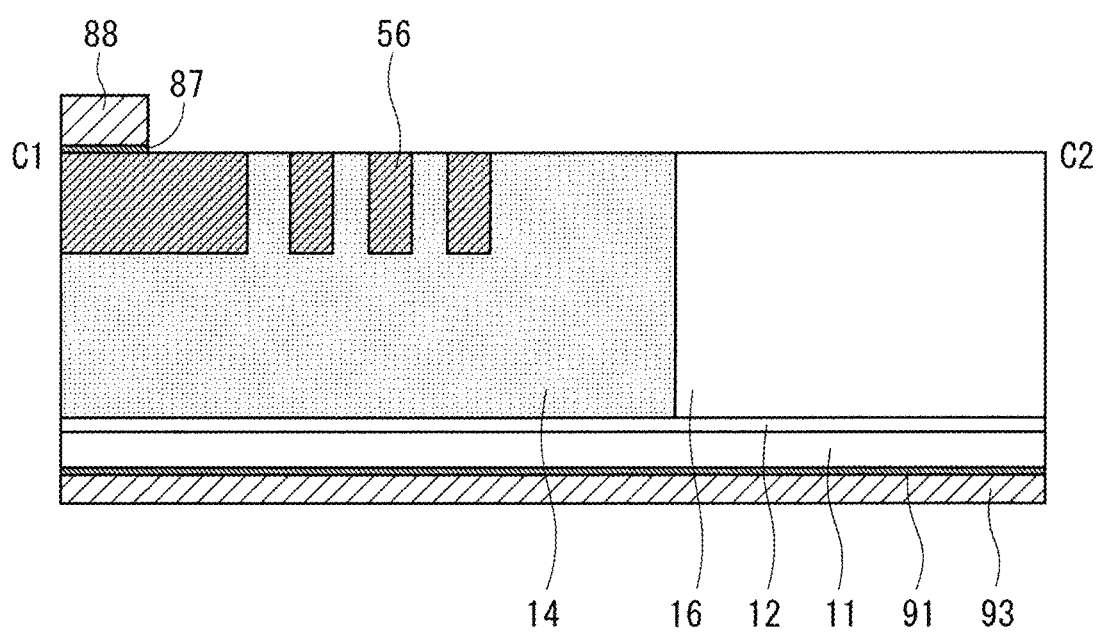
FIG. 3 A schematic cross-sectional view illustrating a cross section parallel to the longitudinal direction of the p-type pillar layer of the semiconductor device as the premise technique.

A semiconductor device including a super junction structure as a premise technique is described before describing embodiments of the present invention. FIG. 1 is a schematic plan view of a semiconductor device as a premise technique. This semiconductor device corresponds to that disclosed in Patent Document 1. FIG. 2 is a cross-sectional view along an A1-A2 line in FIG. 1, and FIG. 3 is a cross-sectional view along a C1-C2 line in FIG. 1.

The semiconductor device includes an n$^+$-type semiconductor substrate 11 and an epitaxial crystal layer 12 which is an n-type semiconductor layer formed on a first main surface (a surface on an upper side in paper sheets of FIG. 2 and FIG. 3) of the semiconductor substrate 11. The first main surface of the semiconductor substrate 11 has an OFF angle with respect to a specific crystal plane. The n$^+$ type indicates that it has a higher impurity concentration than an n type.

Formed on an upper layer part of the epitaxial crystal layer 12 is a super junction layer 15 with a stripe shape in which an n-type pillar layer 13 (first pillar layer) and a p-type pillar layer 14 (second pillar layer) each having a reed shape with a longitudinal direction as a step-flow direction are alternately disposed in a plan view. Herein, a region on an outer side of the super junction layer 15 is defined as "an n-type pillar surrounding layer 16".

A Schottky contact electrode 87 is formed on the super junction layer 15 except for an outer peripheral part of the super junction layer 15, and an anode electrode 88 is formed thereon. In FIG. 1, illustrations of the Schottky contact electrode 87 and the anode electrode 88 are omitted.

A plurality of withstand voltage holding structures 56, each of which is a p-type semiconductor region, are concentrically formed on an upper layer part of the super junction layer 15 to surround the Schottky contact electrode 87 in a plan view. A region surrounded by the withstand voltage holding structure 56 on an innermost side is an active region 1, and a region on an outer side of an inner end of the withstand voltage holding structure 56 on the innermost side is a termination region 2.

Each of the plurality of the withstand voltage holding structures 56 includes a straight part parallel to a longitudinal direction of the p-type pillar layer 14 and a straight part perpendicular to the longitudinal direction of the p-type pillar layer 14 in a plan view. Provided on a corner part of each of the plurality of withstand voltage holding structures 56 is a curved part smoothly connecting the straight part extending in parallel to the longitudinal direction of the p-type pillar layer 14 and the straight part perpendicular to the longitudinal direction of the p-type pillar layer 14.

A cathode electrode 93 is formed on a second main surface (a surface on a lower side in paper sheets of FIG. 2 and FIG. 3) of the semiconductor substrate 11 via a back surface ohmic electrode 91.

Figure 4:
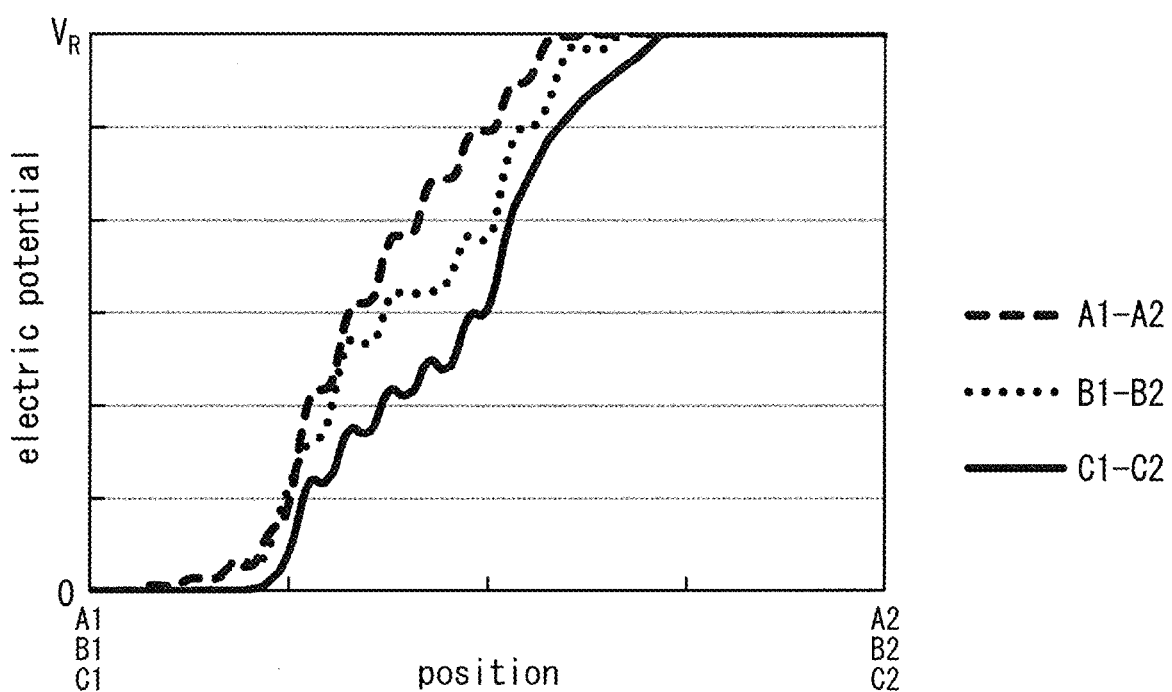
FIG. 4 A graph illustrating a simulation result of a potential distribution in a surface of a semiconductor substrate of the semiconductor device as the premise technique.

FIG. 4 is a graph illustrating a potential distribution on the semiconductor device in FIG. 1 calculated using a technology computer-aided design (TCAD), and is a simulation result of a potential profile along the surface of the semiconductor substrate 11 in a case where a reverse bias of voltage VR is applied to the semiconductor device. In FIG. 4, the graph of a broken line, a dotted line, and a solid line indicates a potential profile along an A1-A2 line, a B1-B2 line, and a C1-C2 line, respectively, in FIG. 1. In FIG. 4, a horizontal axis expresses a position in a direction along the A1-A2 line, the B1-B2 line, or the C1-C2 line, and a vertical axis expresses potential.

In a simulation calculating the potential profile in FIG. 4, a parameter of a width of the n-type pillar layer 13, a width of the p-type pillar layer 14, the number of repeating the n-type pillar layer 13 and the p-type pillar layer 14, the number of withstand voltage holding structures, and a width of each withstand voltage holding structure, for example, does not strictly coincide with that in FIG. 1. The potential profile in FIG. 4 is not a result calculated on an assumption of a three-dimensional structure of the semiconductor device but a result calculated on an assumption that each cross section along the A1-A2 line, the B1-B2 line, and the C1-C2 line in FIG. 1 is independent of each other. That is to say, continuity of potential and electrical field in the revolving direction of the active region 1 is not considered.

When points having the same coordinate in the horizontal axis (corresponding to a distance from an end portion of the active region 1) in FIG. 4 are compared, it is recognized that there is a large potential difference which is several tens of percent of the voltage VR applied to the semiconductor device. As described above, the potential profile illustrated in FIG. 4 is a result calculated on the assumption that each cross section along the A1-A2 line, the B1-B2 line, and the C1-C2 line in FIG. 1 is independent of each other, however, actually, the withstand voltage holding structure 56 is electrically conductive over the whole outer periphery of the active region 1, thus cannot hold the potential difference described above. Accordingly, the potential difference is held between a certain withstand voltage holding structure 56 and another withstand voltage holding structure 56 adjacent to an inner side or an outer side of the certain withstand voltage holding structure 56, and an electrical field concentration occurs in that part.

Embodiment 1

Figure 5:
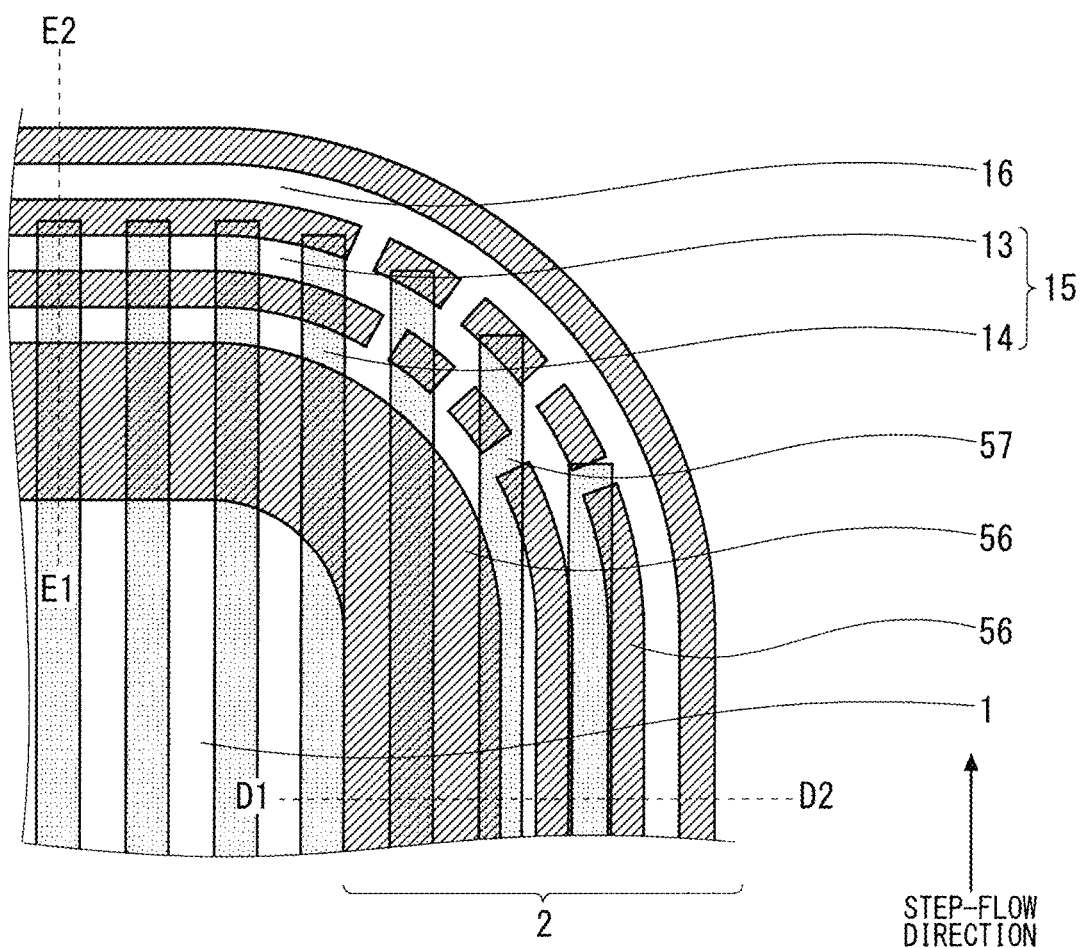
FIG. 5 A schematic plan view around a corner part of a termination structure in a semiconductor device according to an embodiment 1.
Figure 6:
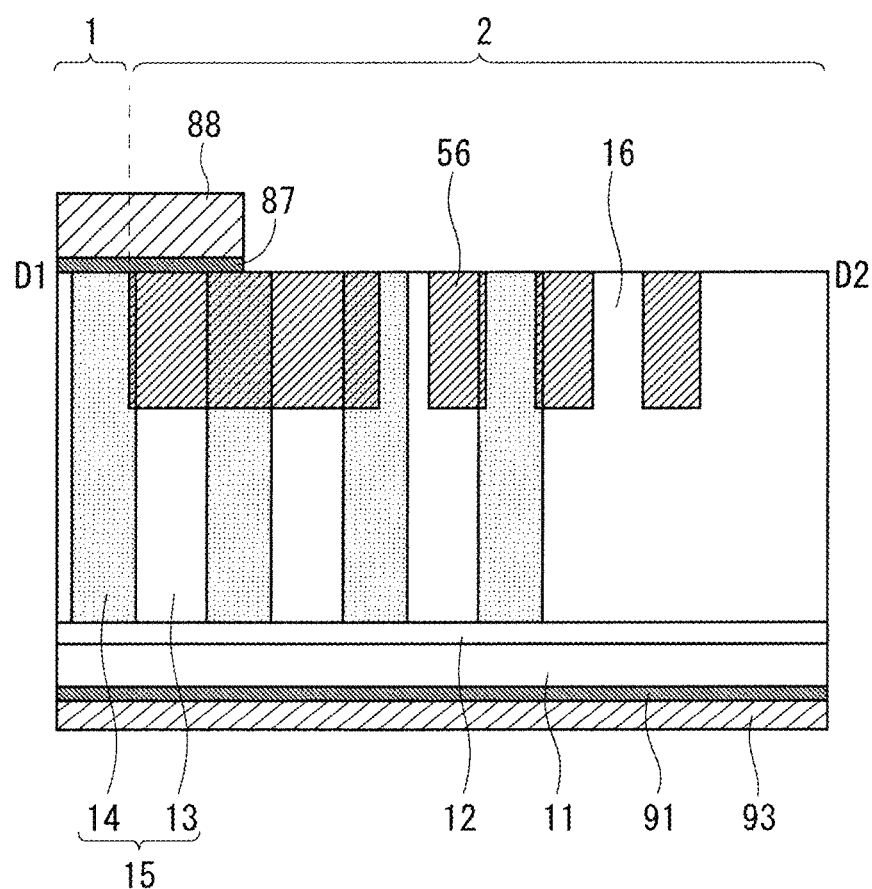
FIG. 6 A schematic cross-sectional view illustrating a cross section vertical to a longitudinal direction of a p-type pillar layer of the semiconductor device according to the embodiment 1.
Figure 7:
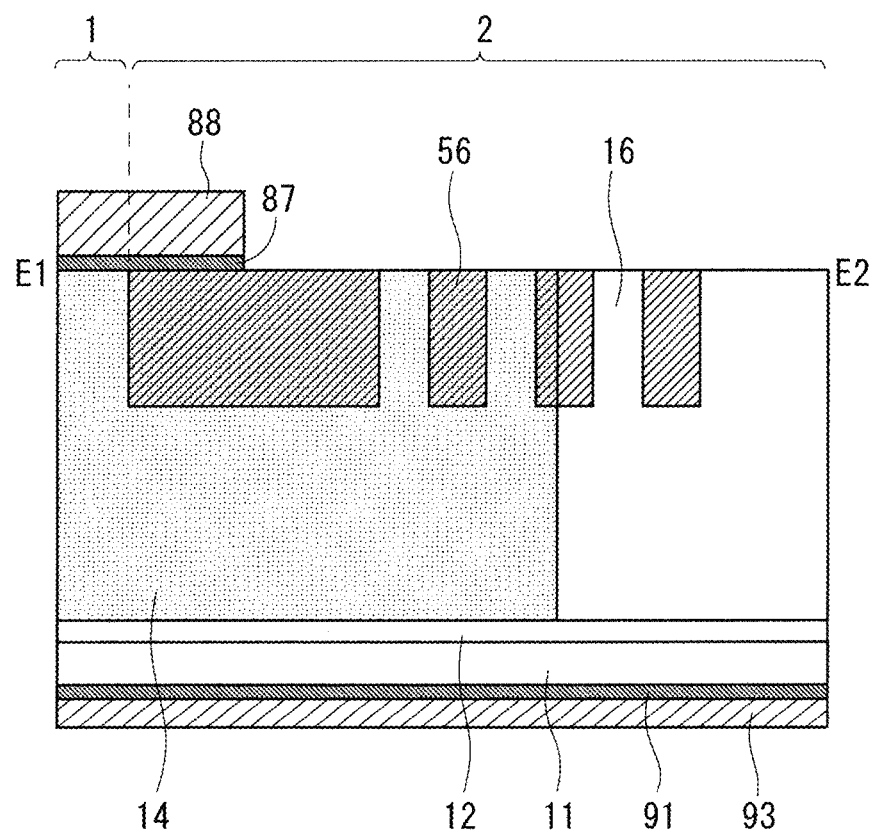
FIG. 7 A schematic cross-sectional view illustrating a cross section parallel to the longitudinal direction of the p-type pillar layer of the semiconductor device according to the embodiment 1.

FIG. 5 is a drawing illustrating a structure of the semiconductor device according to the embodiment 1 of the present invention, and is a schematic plan view around the corner part of the termination structure in the semiconductor device. FIG. 6 is a cross-sectional view along a D1-D2 line in FIG. 5, and FIG. 7 is a cross-sectional view along a E1-E2 line in FIG. 5. In these drawings, the same reference signs are assigned to elements each having functions similar to those in FIG. 1 to FIG. 3.

A region illustrated in FIG. 5 corresponds to an upper right part of the structure illustrated in FIG. 1. Although the illustration is omitted, the semiconductor device according to the embodiment 1 includes the structure illustrated in FIG. 5 in each corner part. A structure except for the corner part may be basically similar to that of the semiconductor device of the premise technique.

The semiconductor device according to the embodiment 1 includes the n$^+$-type semiconductor substrate 11 having low resistance and the epitaxial crystal layer 12 which is the n-type semiconductor layer formed on the first main surface (the surface on an upper side in paper sheets of FIG. 6 and FIG. 7) of the semiconductor substrate 11. In the present embodiment, a silicon carbide substrate is used as the semiconductor substrate 11. Silicon carbide is used as a semiconductor material, thus reduction in loss and increase in an operable temperature of the semiconductor device can be achieved. Used herein as the semiconductor substrate 11 is a silicon carbide substrate with a polytype of 4H having a first main surface with an OFF angle inclined at an angle of 4 degrees in a direction of [11-20] with respect to a (0001) plane. Nitrogen (N), for example, is used as an n-type impurity.

An impurity concentration of the epitaxial crystal layer 12 is equal to or larger than $1\times10^{13}$ cm$^{-3}$ and equal to or smaller than $1\times10^{18}$ cm$^{-3}$, for example, but needs not necessarily be spatially constant, thus may have a concentration distribution in a vertical direction. A thickness of the epitaxial crystal layer 12 is equal to or larger than 0.1 μm and equal to or smaller than 100 μm.

Formed on the upper layer part of the epitaxial crystal layer 12 is the super junction layer 15 in which the n-type pillar layer 13 and the p-type pillar layer 14 each having a reed shape are alternately disposed in a plan view. An impurity concentration of the n-type pillar layer 13 and an impurity concentration of the p-type pillar layer 14 are equal to or larger than $1\times10^{13}$ cm$^{-3}$ and equal to or smaller than $1\times10^{18}$ cm$^{-3}$, for example, but need not necessarily be spatially constant, thus may have a concentration distribution in each region. A width of the n-type pillar layer 13 and a width of the p-type pillar layer are equal to or larger than 1 μm and equal to or smaller than 50 μm, for example. A boundary line between the n-type pillar layer 13 and the p-type pillar layer 14 needs not necessarily be vertical to the first main surface of the semiconductor substrate 11. Aluminum (Al), for example, is used as the p-type impurity.

An amount of n-type effective impurity included in one n-type pillar layer 13 and an amount of p-type effective impurity included in one p-type pillar layer 14 are set to be equal, thus charge balance is achieved. The thickness of the super junction layer 15 is equal to or larger than 1 μm and equal to or smaller than 150 μm, for example. The n-type pillar layer 13 and the p-type pillar layer 14 are disposed in a stripe form and have the longitudinal direction as the step-flow direction in a plan view.

A region on an outer side of the super junction layer 15 is the n-type pillar surrounding layer 16. An impurity concentration of the n-type pillar surrounding layer 16 is equal to or larger than $1\times10^{13}$ cm$^{-3}$ and equal to or smaller than $1\times10^{18}$ cm$^{-3}$, for example, and a thickness of the n-type pillar surrounding layer 16 is equal to or larger than 1 μm and equal to or smaller than 150 μm, for example.

As described hereinafter, in the present embodiment, the super junction layer 15 is formed by a trench-filling method of forming a trench in an n-type epitaxial crystal layer (first semiconductor layer) formed to have a constant thickness, and embedding a p-type epitaxial crystal layer (second semiconductor layer) in the trench, thereby forming the n-type pillar layer 13 and the p-type pillar layer 14. That is to say, the n-type pillar layer 13 and the n-type pillar surrounding layer 16 are parts of the n-type epitaxial crystal layer where the p-type pillar layer 14 is not formed and the n-type epitaxial crystal layer remains, and particularly, a part sandwiched between the p-type pillar layers 14 is the n-type pillar layer 13, and a part on an outer side of a region where the p-type pillar layer 14 is formed is the n-type pillar surrounding layer 16.

The Schottky contact electrode 87 is formed on the super junction layer 15 except for the outer peripheral part of the super junction layer 15, and the anode electrode 88 is formed thereon (in FIG. 5, illustrations of the Schottky contact electrode 87 and the anode electrode 88 are omitted). For example, titanium (Ti), molybdenum (Mo), tungsten (W), Al, the other metal, alloy, or a lamination body made of these materials can be used as materials of the Schottky contact electrode 87 and the anode electrode 88.

A plurality of withstand voltage holding structures 56, each of which is made up of a p-type semiconductor, are concentrically formed on the upper layer part of the super junction layer 15 and the n-type pillar surrounding layer 16 to surround the Schottky contact electrode 87 in a plan view. An impurity concentration of the withstand voltage holding structure 56 is higher than that of the n-type pillar layer 13 and the n-type pillar surrounding layer 16, and is lower than $1\times10^{18}$ cm$^{-3}$, for example. A region surrounded by the withstand voltage holding structure 56 on the innermost side is the active region 1, and a region on the outer side of the inner end of the withstand voltage holding structure 56 on the innermost side is a termination region 2.

As illustrated in FIG. 5, each of the withstand voltage holding structures 56 includes the straight part parallel to the longitudinal direction of the p-type pillar layer 14 and the straight part perpendicular to the longitudinal direction of the p-type pillar layer 14 in a plan view. A shape of a chip of the semiconductor device of the present embodiment is a rectangular shape having a side parallel to the step-flow direction and a side vertical to the step-flow direction. Thus, each withstand voltage holding structure 56 extends in parallel to the p-type pillar layer 14 near the side of the semiconductor device parallel to the step-flow direction, and each withstand voltage holding structure 56 extends in the direction perpendicular to the p-type pillar layer 14 near the side thereof vertical to the step-flow direction. Provided on the corner part of each of the plurality of withstand voltage holding structures 56 is the curved part smoothly connecting the straight part extending in parallel to the longitudinal direction of the p-type pillar layer 14 and the straight part perpendicular to the longitudinal direction of the p-type pillar layer 14.

In the present embodiment, at least one of the plurality of withstand voltage holding structures 56 is formed to overlap with a part of the Schottky contact electrode 87 in a plan view. More specifically, as illustrated in FIG. 6 and FIG. 7, a part of the withstand voltage holding structure 56 on the innermost side is formed to overlap with the end portion of the Schottky contact electrode 87. The withstand voltage holding structure 56 is formed to extend inside the super junction layer 15 to the n-type pillar surrounding layer 16 on the outer side of the super junction layer 15.

The cathode electrode 93 is formed on the second main surface (the surface on the lower side in the paper sheets of FIG. 2 and FIG. 3) of the semiconductor substrate 11 via the back surface ohmic electrode 91. Nickel (Ni), gold (Au), the other metal, alloy, or a lamination body made of these materials can be used as materials of the back surface ohmic electrode 91 and the cathode electrode 93.

Figure 8:
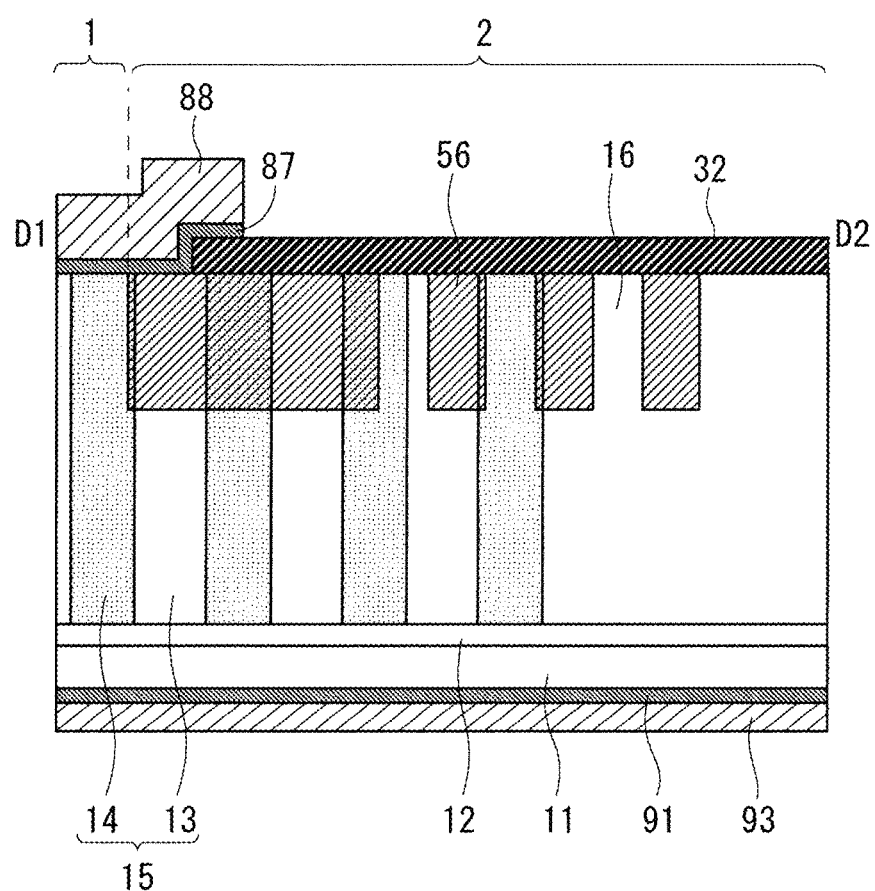
FIG. 8 A drawing illustrating a modification example of the semiconductor device according to the embodiment 1.

As illustrated in FIG. 8, a field insulating film 32 may be formed on the super junction layer 15 and the n-type pillar surrounding layer 16 in a part of the termination region 2. In this case, the Schottky contact electrode 87 and the anode electrode 88 are formed to be partially located on an upper part of the field insulating film 32.

Herein, in the present embodiment, as illustrated in FIG. 5, at least one of the withstand voltage holding structures 56 overlapping with the super junction layer 15 in a plan view includes a gap 57. That is to say, the withstand voltage holding structure 56 including the gap 57 does not have a completely continuous frame-like shape, but is intermittently formed, and an intermittent part constitutes the gap 57. In other words, the gap 57 passes across the withstand voltage holding structure 56 to which the gap 57 belongs, and connects an inner region and an outer region of the withstand voltage holding structure 56. The part corresponding to the gap 57 may be an n-type semiconductor region or a p-type semiconductor region having a lower impurity concentration than the withstand voltage holding structure 56. In the example in FIG. 5, a part of the gap 57 overlapping with the n-type pillar layer 13 is an n-type semiconductor region, and a part of the gap 57 overlapping with the p-type pillar layer 14 is a p-type semiconductor region.

When a part of the gap 57 is an n-type semiconductor region, an impurity concentration thereof may be the same as or different from that of the n-type pillar layer 13. When a part of the gap 57 is a p-type semiconductor region, it is sufficient that it has a lower impurity concentration than the withstand voltage holding structure 56 and has an impurity concentration so as to be depleted at a time of application of a reverse bias. Alternatively, a part of the gap 57 may be formed of any material including an intrinsic semiconductor as long as it is not electrically conductive with the withstand voltage holding structure 56 at the time of application of the reverse bias.

In the embodiment 1, as illustrated in FIG. 5, the gaps 57 are provided in the curved parts of all of the withstand voltage holding structures 56 overlapping with the super junction layer 15 in a plan view. In the meanwhile, the gap 57 is not provided in the withstand voltage holding structure 56 (the withstand voltage holding structure 56 on the outermost side) which does not overlap with the super junction layer 15 in a plan view. The gap 57 is not provided in the straight part of the withstand voltage holding structure 56. Moreover, the gaps 57 of the adjacent withstand voltage holding structures 56 are disposed to be displaced from each other so as not to be adjacent to each other in a radial direction of the withstand voltage holding structure 56 (that is to say, a direction directed from an inner side to an outer side of a frame of the withstand voltage holding structure 56) in a plan view.

A method of manufacturing the semiconductor device according to the embodiment 1 is described next. FIG. 9 to FIG. 18 are process drawings for explaining the manufacturing method. These process drawings correspond to a cross section illustrated in FIG. 6, that is to say, a cross section along a D1-D2 line in FIG. 5.

As described above, the method of forming the super junction structure mainly includes two method of the multi-epitaxial method and the trench-filling method. The multi-epitaxial method is the method of repeating the epitaxial growth of the n-type semiconductor layer and the ion implantation of the p-type impurity. In the super junction structure, it is effective to increase the depth of the p-type pillar layer 14 to improve the withstand voltage. In the multi-epitaxial method, the number of repeating the process is determined by the necessary thickness of the super junction layer 15 and the implantable depth of the ion implantation. For example, when the p-type impurity can be implanted to the depth of 1 μm by the ion implantation, the repeat of the epitaxial growth and the ion implantation needs to be performed at least ten times to form the super junction layer 15 having the thickness of 10 μm.

In the meanwhile, the trench-filling method is the method of epitaxially growing the n-type first semiconductor layer to have the thickness necessary for the super junction layer 15 firstly, forming the trench in the semiconductor layer by anisotropic etching, and then epitaxially growing the p-type second semiconductor layer to fill the trench. Assuming that the super junction layer 15 having a practical thickness is formed, the trench-filling method has the small number of processes, and is excellent in mass productivity compared with the multi-epitaxial method. Thus, the trench-filling method is used in the present embodiment.

Figure 9:
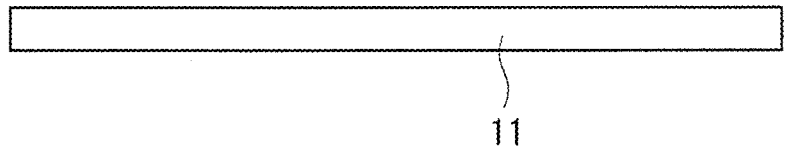
FIG. 9 A drawing for explaining a method of manufacturing the semiconductor device according to the embodiment 1.
Figure 10:
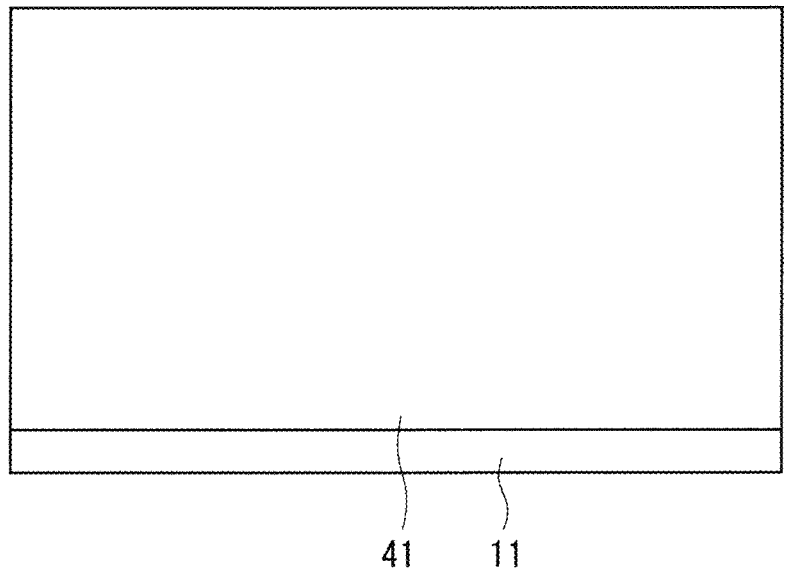
FIG. 10 A drawing for explaining a method of manufacturing the semiconductor device according to the embodiment 1.

Firstly, the n$^+$-type semiconductor substrate 11 is prepared as illustrated in FIG. 9. Next, as illustrated in FIG. 10, an epitaxial crystal layer 41 (first semiconductor layer) made of an n-type silicon carbide is epitaxially grown on the semiconductor substrate 11 by a chemical vapor deposition (CVD) method. The epitaxial crystal layer 41 becomes the epitaxial crystal layer 12, the n-type pillar layer 13, and the n-type pillar surrounding layer 16 in a subsequent process. A thickness of the epitaxial crystal layer 41 may be appropriately set in accordance with the thickness of the super junction layer 15 to be formed.

Figure 11:
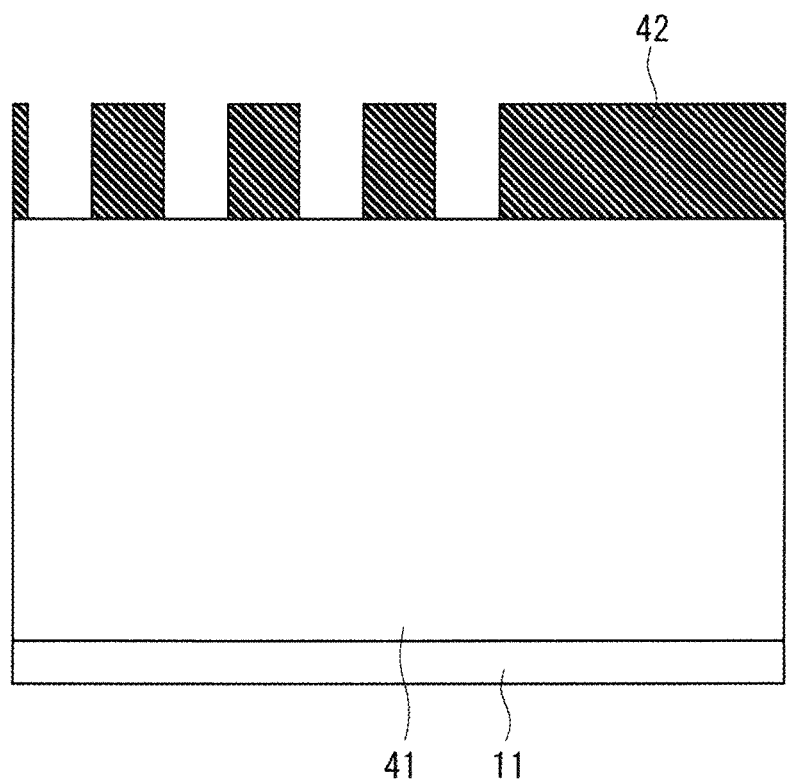
FIG. 11 A drawing for explaining a method of manufacturing the semiconductor device according to the embodiment 1.

Next, a silicon oxide film 42 is deposited on a surface of the epitaxial crystal layer 41, and the silicon oxide film 42 is patterned by selective etching using a photolithography technique, thus a mask pattern made up of the silicon oxide film 42 is formed as illustrated in FIG. 11. This mask pattern is used as a mask at a time of etching for forming the trench in which the p-type pillar layer 14 is embedded. In the present embodiment, the p-type pillar layer 14 is disposed in the stripe form, thus an opening having a stripe shape is provided in the mask pattern. A thickness of the silicon oxide film 42 may be appropriately set in accordance with a depth of the trench (a thickness of the p-type pillar layer 14) to be formed.

Figure 12:
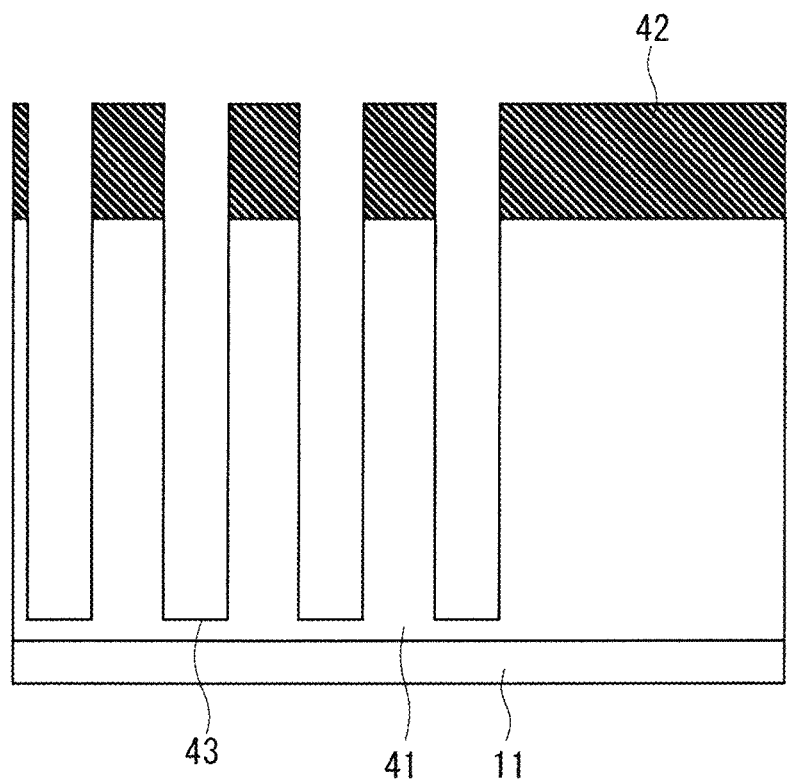
FIG. 12 A drawing for explaining a method of manufacturing the semiconductor device according to the embodiment 1.

Subsequently, a trench 43 for embedding the p-type pillar layer 14 ("pillar formation trench 43" hereinafter) is formed in the epitaxial crystal layer 41 as illustrated in FIG. 12 by etching using the mask pattern made up of the silicon oxide film 42 as a mask. The silicon oxide film 42 as the mask pattern is formed at intervals on the surface of the epitaxial crystal layer 41, thus the plurality of pillar formation trenches 43 are formed at intervals. A shape of the p-type pillar layer 14 is regulated by a shape of the pillar formation trench 43, thus this etching process is preferably performed by dry etching in which a shape of the trench can be easily controlled.

Figure 13:
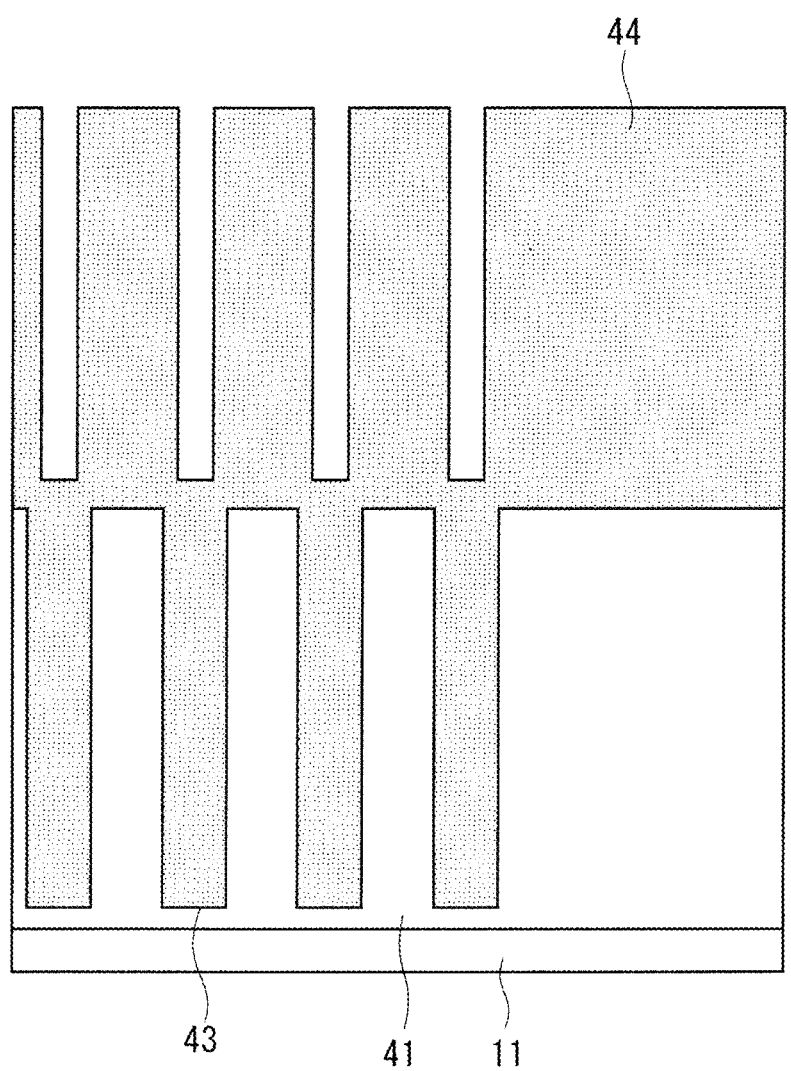
FIG. 13 A drawing for explaining a method of manufacturing the semiconductor device according to the embodiment 1.

Moreover, an epitaxial crystal layer 44 (second semiconductor layer) made up of a p-type silicon carbide is grown by the epitaxial growth to embed the pillar formation trench 43 as illustrated in FIG. 13. The epitaxial crystal layer 44 becomes the p-type pillar layer 14 in a subsequent process. Thus, at the time of forming the epitaxial crystal layer 44, an impurity concentration of the p-type epitaxial crystal layer 44 is set to be equal to the amount of the effective impurity of the n-type pillar layer 13 to achieve charge balance.

Figure 14:
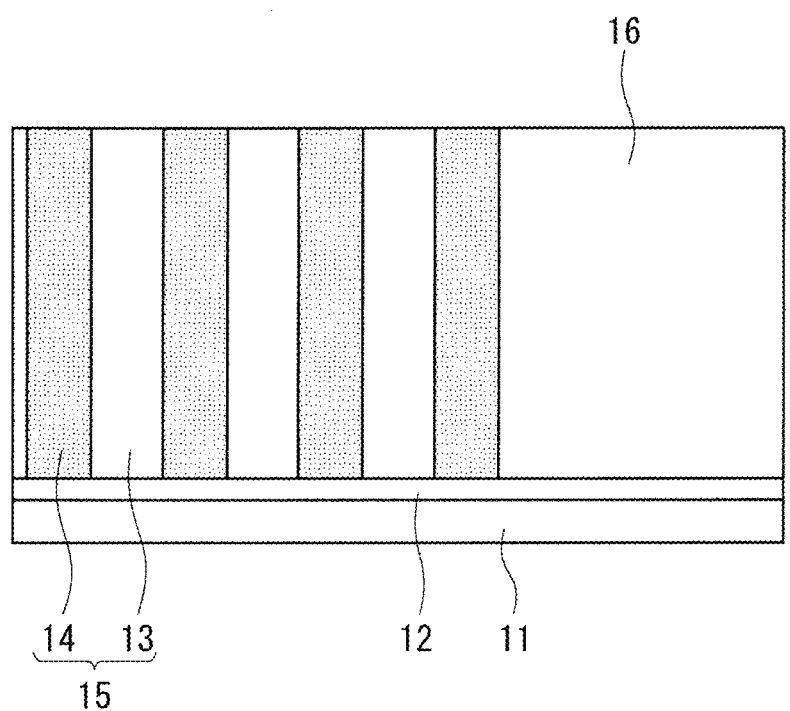
FIG. 14 A drawing for explaining a method of manufacturing the semiconductor device according to the embodiment 1.

Performed next is a flattening process of removing unnecessary parts of the n-type epitaxial crystal layer 41 and the p-type epitaxial crystal layer 44 by chemical mechanical polishing (CMP) to expose the n-type epitaxial crystal layer 41 on an upper surface side of the semiconductor substrate 11 as illustrated in FIG. 14. The p-type epitaxial crystal layer 44 remaining after the flattening process becomes the p-type pillar layer 14.

After the flattening process, the n-type epitaxial crystal layer 41 is divided into three regions of the epitaxial crystal layer 12, the n-type pillar layer 13, and the n-type pillar surrounding layer 16 illustrated in FIG. 6. Firstly, a region sandwiched between the p-type pillar layers 14 in the n-type epitaxial crystal layer 41 becomes the n-type pillar layer 13. A region which is located in the same height as the n-type pillar layer 13 in a cross-sectional view but is not sandwiched between the p-type pillar layers 14 (a region on an outer side of a formation region of the p-type pillar layer 14) becomes the n-type pillar surrounding layer 16 in the n-type epitaxial crystal layer 41. Moreover, a region between a bottom of the super junction layer 15 made up of the n-type pillar layer 13 and the p-type pillar layer 14 and the semiconductor substrate 11 becomes the epitaxial crystal layer 12 in the n-type epitaxial crystal layer 41.

Figure 15:
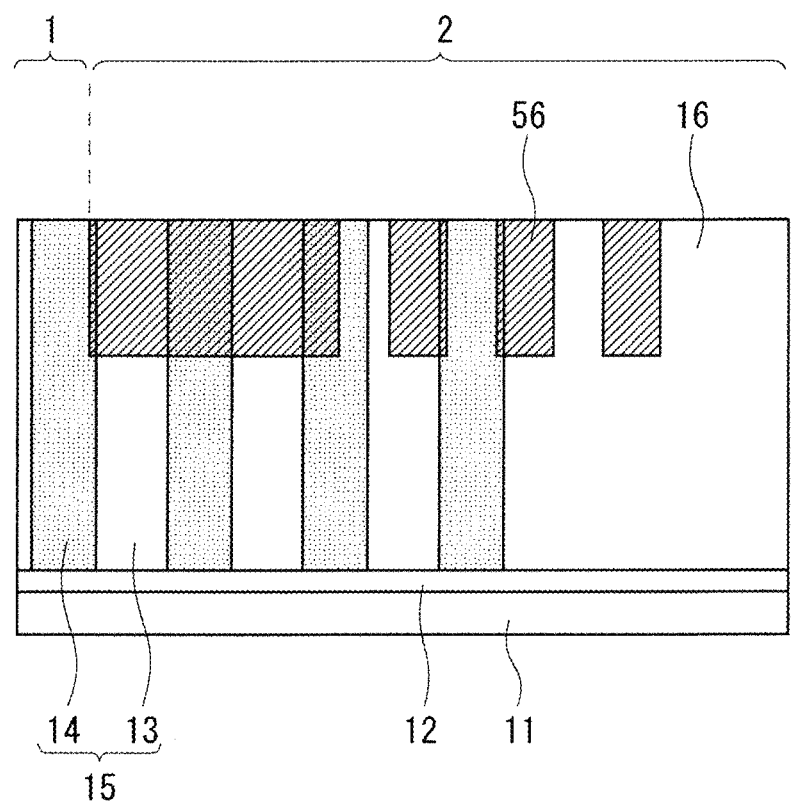
FIG. 15 A drawing for explaining a method of manufacturing the semiconductor device according to the embodiment 1.

Next, an implantation mask in which a formation region of the withstand voltage holding structure 56 except for a portion of the gap 57 is opened is formed on the super junction layer 15 and the n-type pillar surrounding layer 16 using a photoresist, for example. That is to say, the formation region of the gap 57 is covered by the implantation mask. Then, p-type impurity such as Al ion, for example, is ion-implanted in the upper layer part of the semiconductor layer including the super junction layer 15 and the n-type pillar surrounding layer 16 from the implantation mask, thus the plurality of withstand voltage holding structures 56 are formed as illustrated in FIG. 15. At this time, the gap 57 is provided in at least one of the withstand voltage holding structures 56 overlapping with the super junction layer 15 in a plan view (the gap 57 is located in a depth direction in a paper sheet of FIG. 15, thus is not shown therein). After the withstand voltage holding structure 56 is formed, the implantation mask is removed.

The region surrounded by the withstand voltage holding structure 56 on the innermost side is the active region 1, and the region on the outer side of the inner end of the withstand voltage holding structure 56 on the innermost side is the termination region 2.

Next, anneal processing is performed at a temperature of 1500 to 2100° C. for thirty seconds to one hour, for example, in an inactive gas atmosphere such as argon (Ar) gas or vacuum. The implanted ions are electrical activated by the anneal processing.

Herein, when the termination region 2 partially includes the field insulating film 32 as illustrated in FIG. 8, a silicon oxide film is formed on a whole surface of the semiconductor layer including the super junction layer 15 and the n-type pillar surrounding layer 16 by a CVD method, for example. Then, the silicon oxide film is patterned by selective etching using a photolithography technique to form the field insulating film 32.

Figure 16:
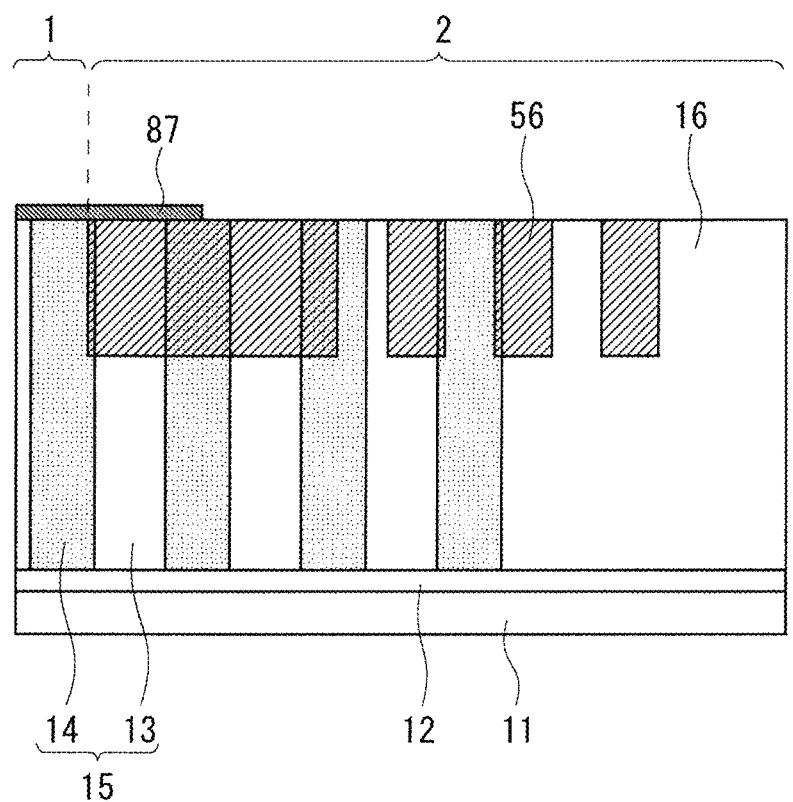
FIG. 16 A drawing for explaining a method of manufacturing the semiconductor device according to the embodiment 1.

Next, a film formation technique such as a sputtering method or a vacuum deposition method and a patterning technique such as a photolithography method are combined to form the Schottky contact electrode 87 on the super junction layer 15 as illustrated in FIG. 16. The Schottky contact electrode 87 is formed in a range including the whole active region 1 in a plan view.

Figure 17:
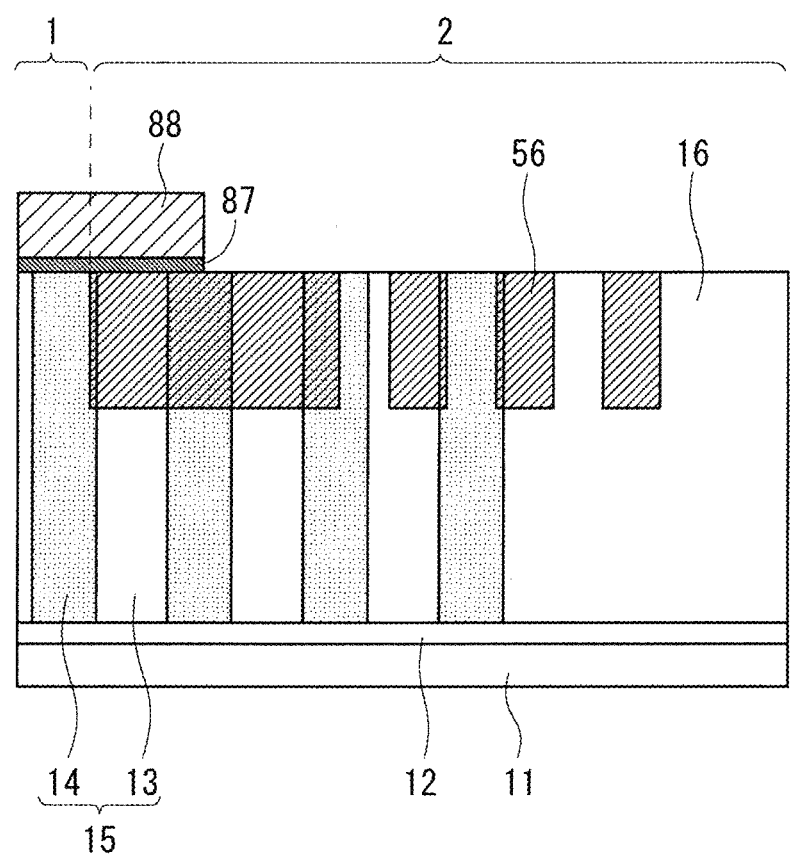
FIG. 17 A drawing for explaining a method of manufacturing the semiconductor device according to the embodiment 1.

Moreover, a film formation technique such as a sputtering method or a vacuum deposition method and a patterning technique such as a photolithography method are combined to form the anode electrode 88 on the Schottky contact electrode 87 as illustrated in FIG. 17. The anode electrode 88 is formed in a range including at least a part of the Schottky contact electrode 87 in a plan view.

Figure 18:
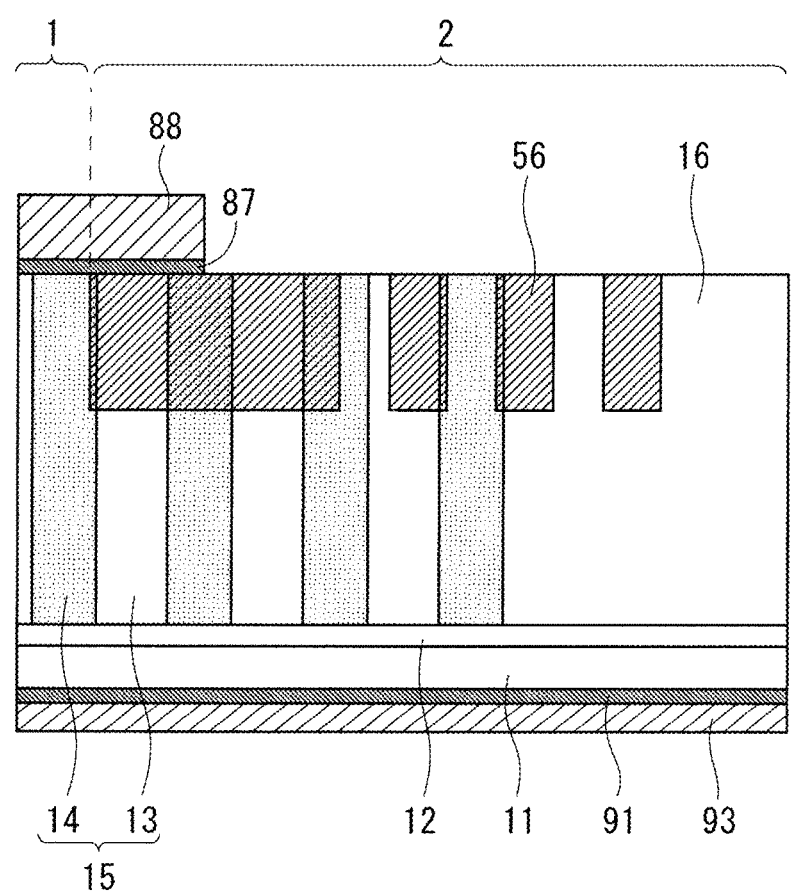
FIG. 18 A drawing for explaining a method of manufacturing the semiconductor device according to the embodiment 1.

Subsequently, the back surface ohmic electrode 91 and the cathode electrode 93 are formed on the second main surface of the semiconductor substrate 11 as illustrated in FIG. 18 by a sputtering method or a vacuum deposition method, for example. Accordingly, the semiconductor device having the structure illustrated in FIG. 5 to FIG. 7 (or FIG. 8) is completed.

Next, an operation of the semiconductor device according to the embodiment 1 is described in an ON state and an OFF state. The ON state is a state where positive voltage equal to or larger than a predetermined threshold value based on potential of the cathode electrode 93 is applied to the anode electrode 88, and current flows from the anode electrode 88 to the cathode electrode 93. The OFF state is a state where negative voltage is applied to the anode electrode 88 based on potential of the cathode electrode 93, current does not flow, and an insulation breakdown does not occur. Particularly herein, a state where negative high voltage is applied to the anode electrode 88 and a depletion layer extends to the whole super junction layer 15 is referred to as the OFF state.

In the OFF state, a line of electric force is connected between the n-type pillar layer 13 and the p-type pillar layer 14 in a horizontal direction, thus the super junction layer 15 is depleted, and voltage in the semiconductor device in a vertical direction is held by the depleted super junction layer 15.

Herein, in a semiconductor device which does not have the super junction structure, when an impurity concentration of an n-type conductive region is increased, the depletion layer hardly extends and withstand voltage decreases, thus the withstand voltage and the ON resistance has a trade-off relationship. In contrast, in the semiconductor device having the super junction structure, hardness of extension of the depletion layer occurring when the impurity concentration of the n-type conductive region is increased can be compensated by reducing a pitch of repeating the p-type pillar layer 14 and the n-type pillar layer 13, thus a trade-off between the withstand voltage and the ON resistance can be improved.

In the actual semiconductor device, the end portion of the chip surface in the OFF state has the same potential as the cathode electrode 93, thus also in the semiconductor device of the embodiment 1, the potential difference between the anode electrode 88 and the end portion of the chip surface is increased. Thus, an electrical field concentration in the horizontal direction of the semiconductor device needs to be reduced by using the withstand voltage holding structure 56.

The example of the potential distribution in the horizontal direction of the chip in the semiconductor device as the premise technique in which the withstand voltage holding structure 56 does not have the gap 57 is as illustrated in FIG. 4. When the withstand voltage holding structure 56 does not have the gap 57, each withstand voltage holding structure 56 has the same potential over the whole outer periphery of the active region 1. This indicates that an equipotential line cannot pass across the withstand voltage holding structure 56. Thus, in the semiconductor device as the premise technique, the potential difference which originally occurs is held in the region between a certain withstand voltage holding structure 56 and another withstand voltage holding structure 56 adjacent to the inner side or the outer side of the certain withstand voltage holding structure 56, and an electrical field concentration occurs in that part.

In the semiconductor device of the embodiment 1, the gap 57 is provided in the withstand voltage holding structure 56 overlapping with the super junction layer 15 in a plan view to solve this problem. When the withstand voltage holding structure 56 has the gap 57, an equipotential line can pass across the withstand voltage holding structure 56 through the gap 57. Accordingly, there is no limitation that the withstand voltage holding structure 56 has the same potential over the whole outer periphery of the active region 1, thus a degree of freedom in the potential distribution is increased, and the electrical field concentration is reduced.

Particularly when the gap 57 is disposed so that meandering of the equipotential line is suppressed as much as possible, a concentration of the equipotential line (that is to say, a concentration of an electrical field) can be further suppressed, thus such a configuration is effective.

Figure 19:
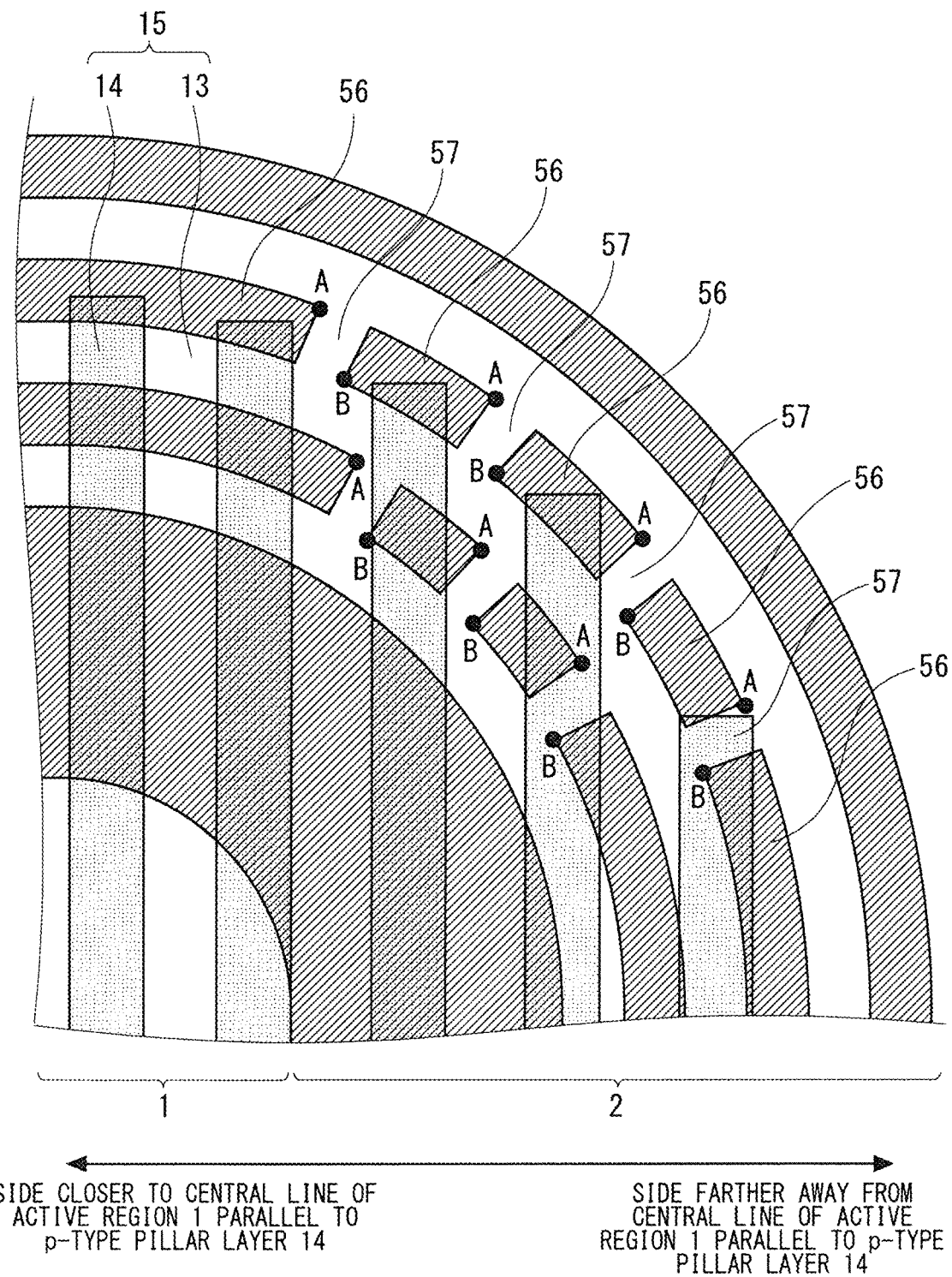
FIG. 19 A drawing for explaining gap boundary end portions A and B.

An arrangement of the gap 57 suppressing the meandering of the equipotential line is described. Each gap 57 has two boundary lines with the withstand voltage holding structure 56 to which the gap 57 belongs, and herein, as illustrated in FIG. 19, an end portion, on a side farther away from a center of the active region 1, of the boundary line closer to a central line of the active region 1 parallel to the longitudinal direction of the p-type pillar layer 14 (simply referred to as "the central line of the active region 1" hereinafter) in the two boundary lines is defined as "a gap boundary end portion A". An end portion, on a side closer to the center of the active region 1, of the boundary line on a side farther away from the central line of the active region 1 in the two boundary lines is defined as "a gap boundary end portion B".

In this case, when the gap boundary end portion A is located on a side closer to the central line of the active region 1 than the gap boundary end portion B in each gap 57, the meandering of the equipotential line is suppressed. That is to say, it is preferable that in each gap 57, the gap boundary end portion A is located on a side closer to the central line of the active region 1 than a straight line parallel to the longitudinal direction of the p-type pillar layer 14 passing through the gap boundary end portion B. In FIG. 19, the gap boundary end portion A is preferably located closer to a left side than the gap boundary end portion B (FIG. 19 is a drawing for explaining the gap boundary end portion A and the gap boundary end portion B, thus does not illustrate a preferable positional relationship between the gap boundary end portion A and the gap boundary end portion B).

The potential distribution illustrated in FIG. 4 is calculated on the assumption of the super junction layer 15 having the stripe shape as illustrated in FIG. 1. In FIG. 4, the potential profiles along the A1-A2 line, the B1-B2 line, and the C1-C2 line in FIG. 1 are different from each other by reason that the p-type pillar layer 14 is not rotationally symmetric with respect to the center of the active region 1 in a plan view, that is to say, the super junction layer 15 is not rotationally symmetric with respect to the center of the active region 1 in a plan view.

Thus, the problem of the electrical field concentration in the premise technique described above (the problem of the electrical field concentration occurring when the potential difference is held in the region between the certain withstand voltage holding structure 56 and another withstand voltage holding structure 56 adjacent to the inner side or the outer side of the certain withstand voltage holding structure 56) is not a problem occurring only in the case where the super junction layer 15 has the stripe shape, but is a problem widely occurring in the case where the super junction layer 15 is not rotationally symmetric with respect to the center of the active region 1. Accordingly, the present embodiment widely has an effect not only in the case where the super junction layer 15 has the stripe shape but also in the case where the super junction layer 15 is not rotationally symmetric with respect to the center of the active region 1 in a plan view.

In the semiconductor device according to the embodiment 1, the gap 57 is provided in the curved part of the withstand voltage holding structure 56. The graph illustrated in FIG. 4 indicates that the potential distribution significantly changes around the B1-B2 line from a position of the A1-A2 line toward the position of the C1-C2 line via the position of the B1-B2 line in FIG. 1, that is to say, at the curved part of the withstand voltage holding structure 56, and the electrical field concentration occurs. The gap 57 is provided in the curved part of the withstand voltage holding structure 56, thus the effect of reducing the electrical field can be increased, and the withstand voltage of the semiconductor device can be increased.

In the semiconductor device according to the embodiment 1, the gap 57 is not provided in the straight part of the withstand voltage holding structure 56. The reason is that the potential distribution is small in the straight part of the withstand voltage holding structure 56, the electrical field concentration which should be reduced is small, and if the gap 57 is provided in the straight part of the withstand voltage holding structure 56, there is a possibility that the depletion of the n-type semiconductor region around the gap 57 is suppressed and the electrical field is hardly held. In other words, the gap 57 is not provided in the straight part of the withstand voltage holding structure 56, thus there is a constant effect in increasing the withstand voltage of the semiconductor device.

In the semiconductor device according to the embodiment 1, the gaps 57 of the adjacent withstand voltage holding structures 56 are disposed to be displaced from each other so as not to be adjacent to each other in the radial direction of the withstand voltage holding structure 56 (that is to say, the direction directed from the inner side to the outer side of the frame of the withstand voltage holding structure 56) in a plan view. There is a possibility that the depletion of the n-type semiconductor region around the gap 57 is suppressed and the electrical field is hardly held, thus the gaps 57 are displaced from each other to prevent the region hardly holding the electrical field from being continuously located. In other words, the gaps 57 between the adjacent withstand voltage holding structures 56 are disposed not to be adjacent to each other in the radial direction of the withstand voltage holding structure 56, thus a constant effect can be achieved in increasing the withstand voltage of the semiconductor device.

In the semiconductor device according to the embodiment 1, the semiconductor substrate 11 made of silicon carbide is used, and the super junction layer 15 and the epitaxial crystal layer in which the withstand voltage holding structure 56 is formed are also made of silicon carbide. Generally, ions implanted in the semiconductor layer are diffused at a time of thermal processing, thus it is hard to form an ion implantation region having a minute pattern. However, the diffusion hardly occurs in silicon carbide, thus when silicon carbide is used, the shape can be easily controlled in forming a minute pattern such as the gap 57, and the effect of increasing the withstand voltage can be achieved more easily than the case of using silicon.

Moreover, in the semiconductor device according to the embodiment 1, the p-type impurity concentration of the withstand voltage holding structure 56 per unit area is set equal to or larger than $1 \times 10^{13}$ cm$^{-2}$. This indicates that when the withstand voltage holding structure 56 is formed by ion implantation, a dose amount is equal to or larger than $1 \times 10^{13}$ cm$^{-2}$. When the p-type impurity concentration of the withstand voltage holding structure 56 is smaller than a constant value, the depletion of the n-type semiconductor region around the withstand voltage holding structure 56 is not sufficiently performed, and causes the reduction in the withstand voltage. The p-type impurity concentration of the withstand voltage holding structure 56 per unit area is set equal to or larger than $1 \times 10^{13}$ cm$^{-2}$, thus the n-type semiconductor region around the withstand voltage holding structure 56 can be reliably depleted. In other words, the p-type impurity concentration of the withstand voltage holding structure 56 per unit area is set equal to or larger than $1 \times 10^{13}$ cm$^{-2}$, thus a constant effect can be achieved in increasing the withstand voltage of the semiconductor device.

Embodiment 2

Figure 20:
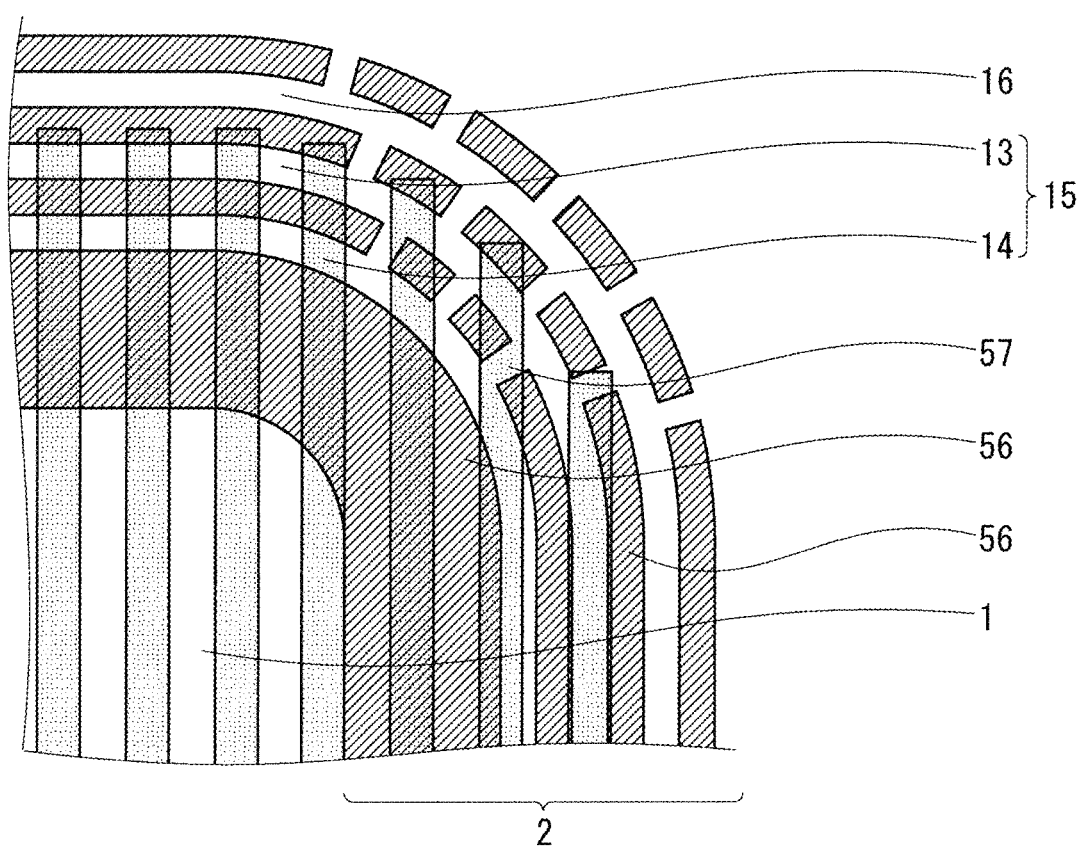
FIG. 20 A schematic plan view around a corner part of a termination structure in a semiconductor device according to an embodiment 2.

FIG. 20 is a plan view illustrating a configuration of the semiconductor device according to the embodiment 2 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 2 are mainly similar to those in the embodiment 1, thus the description of the constituent elements similar to those in the embodiment 1 is omitted, and a configuration specific to the embodiment 2 is described.

In the semiconductor device according to the embodiment 1, the gap 57 is not provided in the withstand voltage holding structure 56 which does not overlap with the super junction layer 15 in a plan view, however, in the semiconductor device according to the embodiment 2, as illustrated in FIG. 20, the gap 57 is provided also in the withstand voltage holding structure 56 (the withstand voltage holding structure 56 on the outermost side) which does not overlap with the super junction layer 15 in a plan view. That is to say, the gap 57 is provided also in the withstand voltage holding structure 56 located in the n-type pillar surrounding layer 16.

When the super junction layer 15 is not rotationally symmetric with respect to the center of the active region 1, the potential distribution of the super junction layer 15 is rotationally asymmetric, and the potential distribution of the n-type pillar surrounding layer 16 is also rotationally asymmetric. Thus, the configuration of locating the gap 57 also in the withstand voltage holding structure 56 located in the position overlapping with the n-type pillar surrounding layer 16 has a constant effect in reducing the electrical field concentration.

The semiconductor device according to the present embodiment can be manufactured by the manufacturing method similar to that of the semiconductor device according to the embodiment 1 by appropriately changing the mask pattern used in the process of forming the withstand voltage holding structure 56 and the gap 57 (FIG. 15).

Embodiment 3

Figure 21:
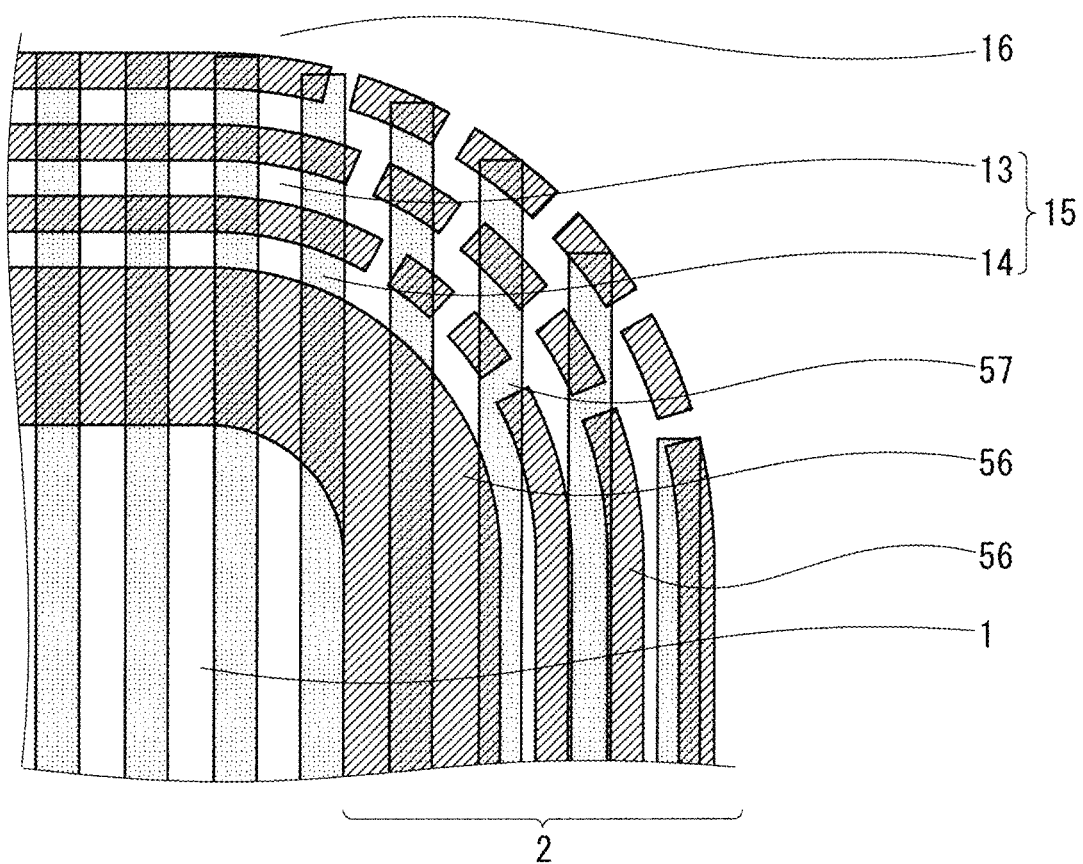
FIG. 21 A schematic plan view around a corner part of a termination structure in a semiconductor device according to an embodiment 3.

FIG. 21 is a plan view illustrating a configuration of a semiconductor device according to an embodiment 3 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 3 are mainly similar to those in the embodiment 2, thus the description of the constituent elements similar to those in the embodiment 2 is omitted, and a configuration specific to the embodiment 3 is described.

In the semiconductor device (FIG. 20) according to the embodiment 2, the withstand voltage holding structure 56 on the outermost side in the plurality of withstand voltage holding structures 56 does not overlap with the n-type pillar surrounding layer 16, however, in the semiconductor device according to the embodiment 3, all of the withstand voltage holding structures 56 are disposed to overlap with the super junction layer 15 as illustrated in FIG. 21. According to this configuration, the electrical field concentration is further reduced in the region near the outer periphery of the chip, thus the withstand voltage of the semiconductor device can be increased.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 4

Figure 22:
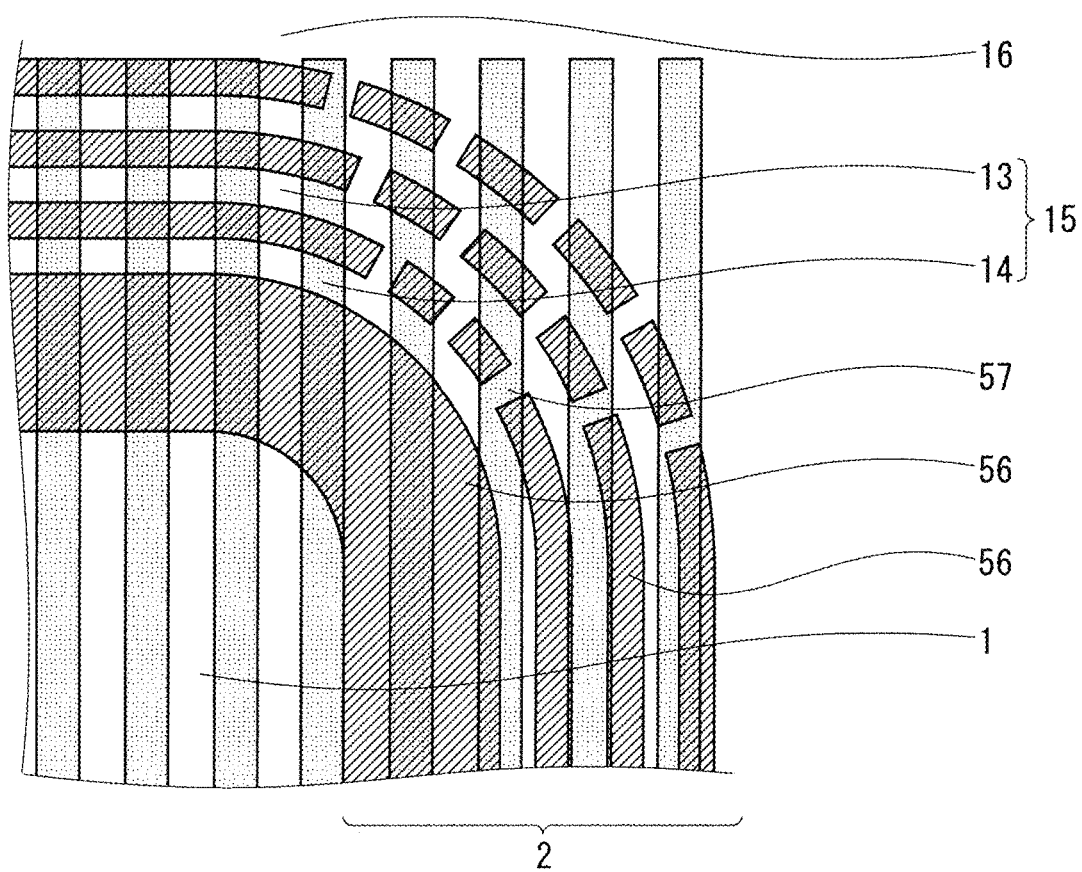
FIG. 22 A schematic plan view around a corner part of a termination structure in a semiconductor device according to an embodiment 4.

FIG. 22 is a plan view illustrating a configuration of a semiconductor device according to an embodiment 4 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 4 are mainly similar to those in the embodiment 3, thus the description of the constituent elements similar to those in the embodiment 3 is omitted, and a configuration specific to the embodiment 4 is described.

In the semiconductor device according to the embodiment 3 (FIG. 21), the position of the outer periphery of the super junction layer 15 and position of the outer periphery of the withstand voltage holding structure 56 on the outermost side coincide with each other, however, in the semiconductor device according to the embodiment 4, as illustrated in FIG. 22, the outer periphery of the super junction layer 15 is located on an outer side of the outer periphery of the withstand voltage holding structure 56 on the outermost side in the corner part (curved part) of the withstand voltage holding structure 56. That is to say, the n-type pillar layer 13 and the p-type pillar layer 14 extend to an outer side of the outer periphery of the withstand voltage holding structure 56 on the outermost side in the corner part of the withstand voltage holding structure 56. According to this configuration, the electrical field concentration is further reduced in the curved part of the withstand voltage holding structure 56, thus the withstand voltage of the semiconductor device can be increased.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 5

FIG. 23 is a plan view illustrating a configuration of a semiconductor device according to an embodiment 5 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 5 are mainly similar to those in the embodiment 4, thus the description of the constituent elements similar to those in the embodiment 4 is omitted, and a configuration specific to the embodiment 5 is described.

In the semiconductor device according to the embodiment 4 (FIG. 22), the outer periphery of the super junction layer 15 is located on the outer side of the outer periphery of the withstand voltage holding structure 56 on the outermost side only in the corner part (curved part) of the withstand voltage holding structure 56, however, in the semiconductor device according to the embodiment 5, as illustrated in FIG. 23, the outer periphery of the super junction layer 15 is located on the outer side of the outer periphery of the withstand voltage holding structure 56 on the outermost side in the whole part (curved part and straight part) of the withstand voltage holding structure 56. That is to say, all of the plurality of withstand voltage holding structures 56 are included by the super junction layer 15. According to this configuration, the electrical field concentration is further reduced on the outer side of the withstand voltage holding structure 56, thus the withstand voltage of the semiconductor device can be increased.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 6

Figure 24:
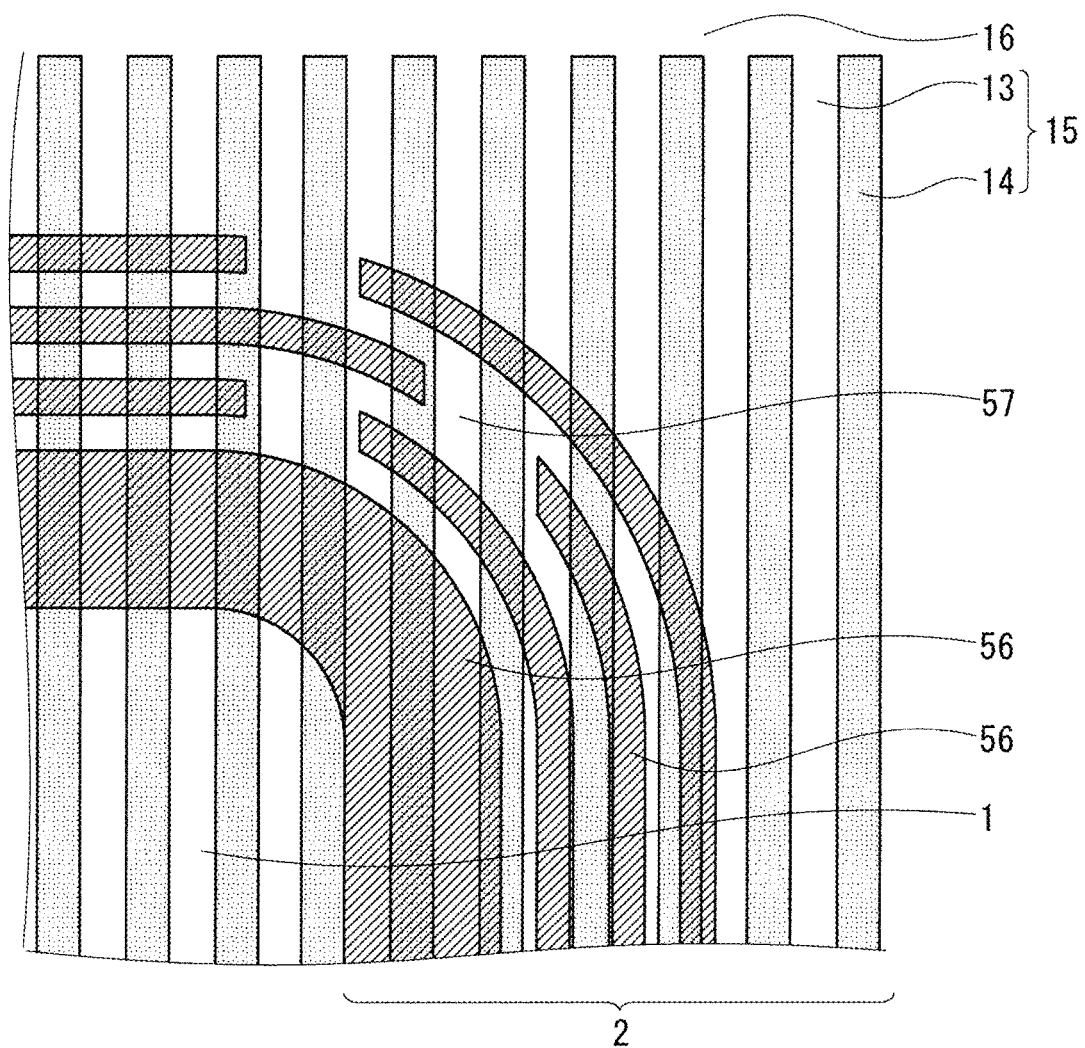
FIG. 24 A schematic plan view around a corner part of a termination structure in a semiconductor device according to an embodiment 6.

FIG. 24 is a plan view illustrating a configuration of a semiconductor device according to an embodiment 6 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 6 are mainly similar to those in the embodiment 5, thus the description of the constituent elements similar to those in the embodiment 5 is omitted, and a configuration specific to the embodiment 6 is described.

As illustrated in FIG. 24, in the semiconductor device according to the embodiment 6, the gap 57 of the withstand voltage holding structure 56 is formed to extend over the n-type pillar layer 13 and the p-type pillar layer 14. In a plan view, the boundary between the gap 57 and the withstand voltage holding structure 56 to which the gap 57 belongs does not have contact (does not have an intersection point and a contact point) with the boundary between the n-type pillar layer 13 and the p-type pillar layer 14.

Moreover, the boundary line on the side closer to the central line of the active region 1 parallel to the longitudinal direction of the p-type pillar layer 14 (simply referred to as "the central line of the active region 1" hereinafter) in the two boundary lines between the gap 57 and the withstand voltage holding structure 56 to which the gap 57 belongs is included by the p-type pillar layer 14 in a plan view. The boundary line on the side farther away from the central line of the active region 1 in the two boundary lines is included in the n-type pillar layer 13 in a plan view.

Shown from the graph in FIG. 4 is that when the p-type pillar layer 14 is formed into the stripe shape, a distance from the end portion of the active region 1 to a position where the potential reaches a specific value (for example, VR/2 or VR) is larger in a case of a direction vertical to the longitudinal direction of the p-type pillar layer 14 (a direction of the A1-A2 line in FIG. 1) than in a case of a direction parallel to the longitudinal direction of the p-type pillar layer 14 (a direction of the C1-C2 line in FIG. 1). This indicates that when an equipotential line is illustrated in a plan view, it is illustrated as a concentric figure whose longitudinal direction is the longitudinal direction of the p-type pillar layer 14 (for example, a figure similar to an oval shape or a rectangular shape whose corners are rounded).

Thus, the equipotential line crossing from an outer side to an inner side of the withstand voltage holding structure 56 through the gap 57 enters an inner side of a portion of the withstand voltage holding structure 56 including the boundary line on a side farther away from the central line of the active region 1 through an outer side of a portion of the withstand voltage holding structure 56 including the boundary line on a side closer to the central line of the active region 1 in the two boundary lines between the gap 57 and the withstand voltage holding structure 56 to which the gap 57 belongs. Accordingly, the electrical field concentration in the gap 57 occurs in the end portion, on the side farther away from the center of the active region 1, of the boundary line on the side closer to the central line of the active region 1 (the gap boundary end portion A in FIG. 19) in the two boundary lines between the gap 57 and the withstand voltage holding structure 56 to which the gap 57 belongs and the end portion, on the side closer to the center of the active region 1, of the boundary line on the side farther away from the central line of the active region 1 (the gap boundary end portion B in FIG. 19) in the two boundary lines.

In the meanwhile, it is experientially known that when both the n-type semiconductor region and the p-type semiconductor region are located in non-one-dimensional form with respect to the direction of the electrical field, the equipotential line is distributed to bulge toward a low potential side in the n-type semiconductor region, and is distributed to bulge toward a high potential side in the p-type semiconductor region.

When the gap 57 is disposed as illustrated in FIG. 24, the gap boundary end portion A located in the outer peripheral part of the withstand voltage holding structure 56 is disposed on the p-type pillar layer 14, and the gap boundary end portion B located in the inner peripheral part of the withstand voltage holding structure 56 is disposed on the n-type pillar layer 13, thus the electrical field concentration in both the gap boundary end portions A and B are reduced, and the withstand voltage of the semiconductor device can be increased. That is to say, the gap boundary end portion A located to a side where potential is low is located on the p-type pillar layer 14, thus the equipotential line bulges from the gap boundary end portion A toward the high potential side, and the electrical field of the gap boundary end portion A is reduced. The gap boundary end portion B located to a side where potential is high is located on the n-type pillar layer 13, thus the equipotential line bulges from the gap boundary end portion B toward the low potential side, and the electrical field of the gap boundary end portion B is reduced.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 7

Figure 25:
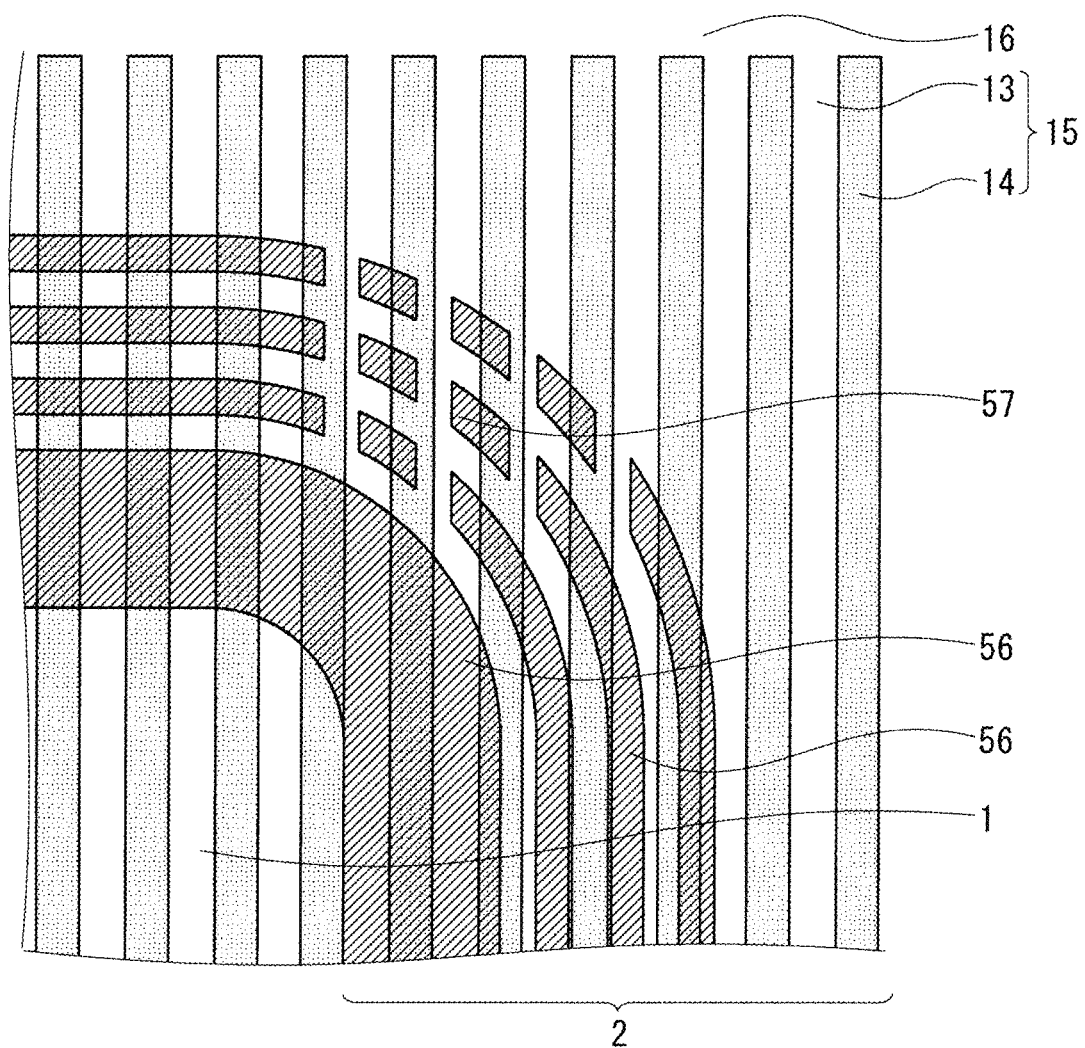
FIG. 25 A schematic plan view around a corner part of a termination structure in a semiconductor device according to an embodiment 7.

FIG. 25 is a plan view illustrating a configuration of a semiconductor device according to an embodiment 7 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 7 are mainly similar to those in the embodiment 6, thus the description of the constituent elements similar to those in the embodiment 6 is omitted, and a configuration specific to the embodiment 7 is described.

In the semiconductor device according to the embodiment 7, as illustrated in FIG. 25, the p-type pillar layer 14 including the boundary line on the side closer to the central line of the active region 1 parallel to the longitudinal direction of the p-type pillar layer 14 in the two boundary lines between the gap 57 and the withstand voltage holding structure 56 to which the gap 57 belongs and the n-type pillar layer 13 including the boundary line on the side farther away from the central line of the active region 1 are adjacent to each other, thus the semiconductor device according to the embodiment 7 is different from that according to the embodiment 6 (FIG. 24) in that point. That is to say, in the present embodiment, the p-type pillar layer 14 where the gap boundary end portion A is located and the n-type pillar layer 13 where the gap boundary end portion B is located are adjacent to each other in a plan view.

According to this configuration, the region which does not include the withstand voltage holding structure 56 is reduced, thus it is suppressed that the depletion layer hardly extends. That is to say, the depletion layer is kept to extend easily, thus reduction in the withstand voltage of the semiconductor device can be prevented.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 8

Figure 26:
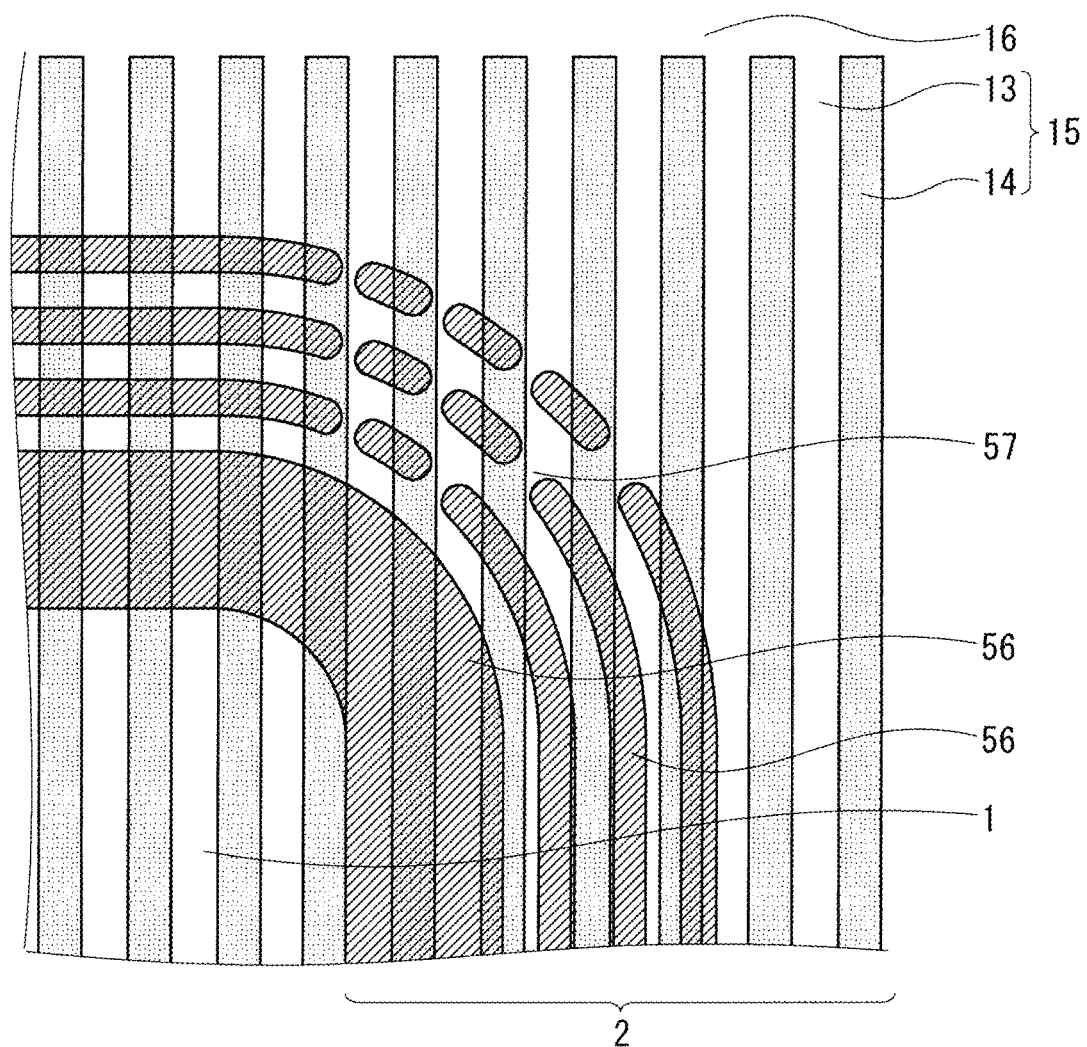
FIG. 26 A schematic plan view around a corner part of a termination structure in a semiconductor device according to an embodiment 8.

FIG. 26 is a plan view illustrating a configuration of a semiconductor device according to an embodiment 8 of the present invention. The description of constituent elements which are unnecessary for explanation (the Schottky contact electrode 87 and the anode electrode 88, for example) is omitted for convenience in drawing figures. Constituent elements of the semiconductor device according to the embodiment 8 are mainly similar to those in the embodiment 7, thus the description of the constituent elements similar to those in the embodiment 7 is omitted, and a configuration specific to the embodiment 8 is described.

In the semiconductor device according to the embodiment 7 (FIG. 25), the boundary line between the gap 57 and the withstand voltage holding structure 56 to which the gap 57 belongs has a straight shape, however, in the semiconductor device according to the embodiment 8, the boundary line between the gap 57 and the withstand voltage holding structure 56 to which the gap 57 belongs has a curved shape as illustrated in FIG. 26. Thus, each of parts of the withstand voltage holding structure 56 divided by the two gaps 57 has an oval shape or band-like shape whose corners are rounded.

According to this configuration, the electrical field concentration is further reduced in the end portion of the boundary line between the gap 57 and the withstand voltage holding structure 56 to which the gap 57 belongs, and the withstand voltage of the semiconductor device can be increased. FIG. 26 illustrates an example that the boundary line between the gap 57 and the withstand voltage holding structure 56 to which the gap 57 belongs is curved in the configuration in the embodiment 7. However, the embodiment 8 is applicable not only to the embodiment 7 but also to any of the embodiments 1 to 6. That is to say, the boundary line between the gap 57 and the withstand voltage holding structure 56 to which the gap 57 belongs is curved also in each configuration in the embodiments 1 to 6, thus the effect of increasing the withstand voltage can be obtained.

The semiconductor device according to the present embodiment can be manufactured by the manufacturing method similar to that of the semiconductor device according to the embodiment 1 by appropriately changing the mask pattern used in the process of forming the pillar formation trench 43 in which the p-type pillar layer 14 is embedded (FIG. 11 and FIG. 12) and the mask pattern used in the process of forming the withstand voltage holding structure 56 and the gap 57 (FIG. 15).

Embodiment 9

In an embodiment 9, the semiconductor device according to the embodiments 1 to 8 is applied to a power conversion device. Described particularly herein is a case of applying a switching element (for example, a MOSFET) including the super junction layer 15 and the withstand voltage holding structure 56 corresponding to the embodiments 1 to 8 and a rectifying element (for example, an SBD) to a three-phase inverter.

Figure 27:
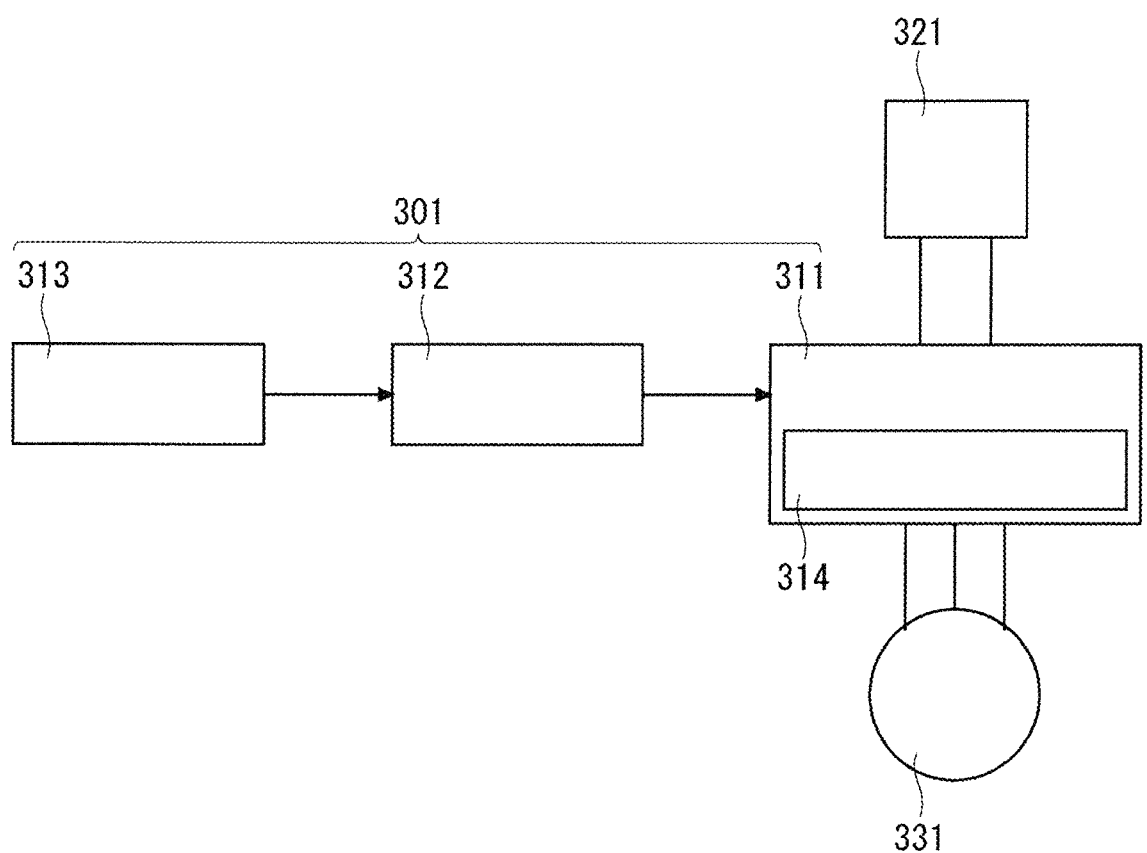
FIG. 27 A block diagram of a power conversion device according to an embodiment 9.

FIG. 27 is a block diagram illustrating a configuration of a power conversion system to which a power conversion device according to the embodiment 9 is applied. The power conversion system illustrated in FIG. 27 is made up of a power conversion device 301, a power source 321, and a load 331.

The power source 321 is a power source converting a commercial AC power source into a DC power by an AC/DC converter, and supplies the DC power to the power conversion device 301.

The power conversion device 301 is a three-phase inverter connected between the power source 321 and the load 331, converts the DC power supplied from the power source 321 into an AC power, and supplies the AC power to the load 331. As illustrated in FIG. 27, the power conversion device 301 includes a main conversion circuit 311 converting the DC power into the AC power and outputs the AC power, a drive circuit 312 outputting a drive signal driving a switching element constituting the main conversion circuit 311, and a control circuit 313 outputting a control signal controlling the drive circuit 312 to the drive circuit 312.

The load 331 is a three-phase electrical motor driven by the AC power supplied from the power conversion device 301.

The main conversion circuit 311 includes a switching element and a rectifying element, and when the switching element is switched, the main conversion circuit 311 converts the DC power supplied from the power source 321 into the AC power, and supplies the AC power to the load 331. Various specific circuit configurations may be applied to the main conversion circuit 311, however, in the present embodiment, the main conversion circuit 311 is a three-phase full-bridge circuit with two levels. The three-phase full-bridge circuit can be made up of six switching elements and six rectifying elements antiparallelly connected to each switching element. The six switching elements are connected two by two in series to constitute upper and lower arms, and each pair of the upper and lower arms constitutes a U phase, a V phase, and a W phase of a full-bridge circuit. Output terminals of the pair of the upper and lower arms, that is to say, three output terminals of the main conversion circuit 311 are connected to the load 331.

Each switching element and each rectifying element constituting the main conversion circuit 311 are a semiconductor device 314 according to any of the embodiments 1 to 8.

The drive circuit 312 generates the drive signal driving the switching element of the main conversion circuit 311, and outputs the generated drive signal to a control electrode of the switching element of the main conversion circuit 311. Specifically, the drive circuit 312 outputs a drive signal for making the switching element enter an ON state and a drive signal for making the switching element enter an OFF state to a control electrode of each switching element in accordance with a control signal outputted from the control circuit 313.

The control circuit 313 controls the switching element of the main conversion circuit 311 so that a desired electrical power is supplied to the load 331. For example, when the main conversion circuit 311 is operated by a pulse width modulation (PWM) control, a switching chart of the switching element is calculated based on an electrical power to be supplied to the load 331, and the control signal for achieving this switching chart is outputted to the drive circuit 312. The drive circuit 312 outputs the ON signal or the OFF signal as the drive signal to the control electrode of each switching element in accordance with the control signal.

The power conversion device according to the present embodiment includes the semiconductor device according to any one of the embodiments 1 to 8 as the semiconductor device 314 constituting the main conversion circuit 311, thus the power conversion device having the high withstand voltage can be achieved.

<Modification Example>

In the embodiments 1 to 8, the SBD is described as the semiconductor device, however, the semiconductor device is not limited to the SBD, but a junction barrier diode (JBS), a pn junction diode, a MOSFET, a junction field-effect transistor (JFET), or an IGBT, for example, may also be applied.

The material of the semiconductor substrate 11 is not limited to silicon carbide, but may also be the other wide gap semiconductor such as silicon, GaN, diamond, a compound semiconductor, and an oxide semiconductor, for example. When the semiconductor substrate 11 has the OFF angle, and the surface on which the uniform epitaxial growth can be performed is limited to the specific crystal plane, the super junction layer 15 is required to have the stripe shape in a plan view regardless of the semiconductor material. Thus, when the semiconductor substrate 11 has the OFF angle, the embodiments 1 to 8 can be applied regardless of the semiconductor material.

In the embodiments 1 to 8, the first main surface of the semiconductor substrate 11 is inclined at the angle of 4 degrees in the direction of [11-20] with respect to the (0001) plane, however, the other crystal plane such as (000-1) plane may be used, and the inclination angle may be the other angle within a range of 0 degree to 8 degrees. A polytype of silicon carbide is not limited to 4H, however, the other polytype such as 3C and 6H may also be applied.

In the embodiments 1 to 8, the first conductivity type is the n type and the second conductivity type is the p type, however, it is also applicable that the first conductivity type is the p type and the second conductivity type is the n type.

In the embodiments 1 to 8, Al is used as the p-type impurity, however, the other III group element such as boron (B) or gallium (Ga) may also be used, for example. In the similar manner, in the embodiments 1 to 8, N is used as the n-type impurity, however, the other V group element such as phosphorus (P) or arsenic (As) may also be used, for example.

In the embodiments 1 to 5, the boundary line between the withstand voltage holding structure 56 and the gap 57 is the straight line extending in the radial direction of the withstand voltage holding structure 56, however, the direction of the boundary line is not limited thereto. The shape of the boundary line is not limited to the straight line, however, an optional shape may also be applied.

In the embodiments 6 to 7, the boundary line between the withstand voltage holding structure 56 and the gap 57 is the straight line extending in the radial direction of the withstand voltage holding structure 14, however, the direction of the boundary line is not limited thereto. The shape of the boundary line is not limited to the straight line, however, an optional shape may also be applied.

An optimal number, width, and arrangement of the gap 57 provided in the withstand voltage holding structure 56 are different depending on a whole design of the withstand voltage holding structure 56, for example, thus are not regulated in detail in the embodiments 1 to 8. However, the optimal number, width, and arrangement of the gap 57 can be obtained using a TCAD when a design of the termination region is determined. Thus, optimal number, width, and arrangement of the gap 57 can be optimized without departing from the scope of the embodiments 1 to 8.

The effect obtained by the semiconductor device including the structure described in the embodiments 1 to 8 does not depend on the method of manufacturing the semiconductor device. That is to say, even when the semiconductor device including the structure described in the embodiments 1 to 8 is manufactured using the manufacturing method other than that described above, the effect similar to that described in the embodiments 1 to 8 can be obtained.

The gap is not provided in the withstand voltage holding structure 56 in the innermost periphery in FIGS. 5, 19, 20, 21, 22, 23, 24, 25, and 26 described in the embodiments 1 to 8. In this case, the potential of the end portion of the Schottky contact electrode 87 having contact with the withstand voltage holding structure 56 in the innermost periphery can be constant, thus breakage of the semiconductor device caused by the local concentration of the current can be prevented. However, the gap may be provided also in the withstand voltage holding structure 56 in the innermost periphery, and when the gap is provided, the effect of reducing the electrical field in the curved part of the withstand voltage holding structure 56 can be obtained.

In the embodiment 9, the power source 321 is the power source in which the commercial AC power source is converted into the DC power by the AC/DC converter, however, the other type of power source is also applicable. The power source 321 may be a rectifying circuit connected to a commercial DC power source, a solar battery, a storage battery, or an AC power source, an output of an AC/DC converter, or an output of a DC/DC converter, for example.

The embodiment 9 exemplifies the three-phase inverter with two levels as the power conversion device, however, a range of application of the embodiments 1 to 8 is not limited to a specific power conversion device. The power conversion device may be an inverter with three level or multiple levels, for example, or may also be a single phase inverter. The embodiments 1 to 8 can also be applied to a DC/DC converter and an AC/DC converter.

In the embodiment 9, the load 331 is the three-phase electrical motor, however, the type of the load 331 is not limited thereto. Applicable as the load 331 is an electrical discharge machine, a laser beam machine, an induction heat cooking machine, a power source device of non-contact power supply system, or a power conditioner used in a solar power generation system or an electrical power storage system, for example.

According to the present invention, each embodiment can be arbitrarily combined, or each embodiment can be appropriately varied or omitted within the scope of the invention.

Although the present invention is described in detail, the foregoing description is in all aspects illustrative and does not restrict the invention. It is therefore understood that numerous modifications and variations can be devised without departing from the scope of the invention.

EXPLANATION OF REFERENCE SIGNS

1 active region, 2 termination region, 11 semiconductor substrate, 12 epitaxial crystal layer, 13 n-type pillar layer, 14 p-type pillar layer, 15 super junction layer, 16 n-type pillar surrounding layer, 32 field insulating film, 41 epitaxial crystal layer, 42 silicon oxide film, 43 pillar formation trench, 44 epitaxial crystal layer, 56 withstand voltage holding structure, 57 gap, 87 Schottky contact electrode, 88 anode electrode, 91 back surface ohmic electrode, 93 cathode electrode, 301 power conversion device, 311 main conversion circuit, 312 drive circuit, 313 control circuit. 314 semiconductor device, 321 power source, 331 load.

The invention claimed is:

1. A semiconductor device, comprising:
   a semiconductor substrate;
   a semiconductor layer formed on the semiconductor substrate and including a super junction layer in which a first pillar layer of a first conductivity type and a second pillar layer of a second conductivity type are alternately disposed; and
   a plurality of withstand voltage holding structures of the second conductivity type formed on an upper layer part of the semiconductor layer to surround an active region, wherein
   at least one of the withstand voltage holding structures overlaps with the super junction layer in a plan view, and
   the at least one of the withstand voltage holding structures overlapping with the super junction layer in a plan view has at least one gap which is an intermittent part of the at least one of the withstand voltage holding structures.

2. The semiconductor device according to claim 1, wherein
   an arrangement of the first pillar layer and the second pillar layer in the super junction layer is rotationally asymmetric in a plan view.

3. The semiconductor device according to claim 1, wherein
   all of the withstand voltage holding structures have the gap.

4. The semiconductor device according to claim 1, wherein
   one of the withstand voltage holding structures in an innermost periphery does not have the gap, and
   all of the withstand voltage holding structures except for one of the withstand voltage holding structures in the innermost periphery have the gap.

5. The semiconductor device according to claim 1, wherein
   all of the withstand voltage holding structures overlap with the super junction layer in a plan view, and have the gap.

6. The semiconductor device according to claim 1, wherein
   all of the withstand voltage holding structures overlap with the super junction layer in a plan view,
   one of the withstand voltage holding structures in an innermost periphery does not have the gap, and all of the withstand voltage holding structures except for one of the withstand voltage holding structures in the innermost periphery have the gap.

7. The semiconductor device according to claim 1, wherein
the first pillar layer and the second pillar layer are disposed in a stripe form in the super junction layer.

8. The semiconductor device according to claim 1, wherein
the gap is formed in a curved part of each of the withstand voltage holding structures.

9. The semiconductor device according to claim 8, wherein
the gap is not formed in a straight part of each of the withstand voltage holding structures.

10. The semiconductor device according to claim 1, wherein
the gap is formed over the first pillar layer and the second pillar layer,
two boundary lines between the gap and each of the withstand voltage holding structures to which the gap belongs do not have contact with a boundary line between the first pillar layer and the second pillar layer, and
a boundary line on a side closer to a central line of the active region parallel to a longitudinal direction of the second pillar layer in the two boundary lines between the gap and each of the withstand voltage holding structures to which the gap belongs is included in the second pillar layer in a plan view, and a boundary line on the side farther away from the central line of the active region is included in the first pillar layer in a plan view.

11. The semiconductor device according to claim 10, wherein
the second pillar layer including the boundary line on the side closer to the central line of the active region in the two boundary lines between the gap and the withstand voltage holding structure to which the gap belongs and the first pillar layer including the boundary line on the side farther away from the central line of the active region are adjacent to each other.

12. The semiconductor device according to claim 1, wherein
the gaps of the withstand voltage holding structures adjacent to each other are disposed to be displaced from each other so as not to be adjacent to each other in a radial direction of the withstand voltage holding structures in a plan view.

13. The semiconductor device according to claim 1, wherein
the semiconductor substrate has an OFF angle.

14. The semiconductor device according to claim 1, wherein
the semiconductor substrate is a silicon carbide substrate.

15. The semiconductor device according to claim 14, wherein
an impurity concentration of a second conductivity type of each of the withstand voltage holding structure is equal to or larger than $1 \times 10^{13}$ cm$^{-2}$.

16. A power conversion device, comprising:
a main conversion circuit including the semiconductor device according to claim 1, converting an electrical power which has been input, and outputting the electrical power;
a drive circuit outputting a drive signal for driving the semiconductor device to the semiconductor device; and
a control circuit outputting a control signal for controlling the drive circuit to the drive circuit.

17. A method of manufacturing a semiconductor device, comprising:
forming a first semiconductor layer of a first conductivity type on a semiconductor substrate;
forming a trench having a stripe shape on the first semiconductor layer, and embedding a second semiconductor layer of a second conductivity type in the trench, thereby forming a super junction layer in which a first pillar layer made up of the first semiconductor layer and a second pillar layer made up of a second semiconductor layer are alternately disposed; and
forming a plurality of withstand voltage holding structures of the second conductivity type on an upper layer part of the first semiconductor layer and the second semiconductor layer including the super junction layer to surround an active region by ion implantation using an implantation mask, wherein
at least one of the withstand voltage holding structures overlaps with the super junction layer in a plan view, and
the at least one of the withstand voltage holding structures overlapping with the super junction layer in a plan view has at least one gap which is an intermittent part of the at least one of the withstand voltage holding structures.

* * * * *